United States Patent [19]
Sanada

[11] Patent Number: 5,864,566
[45] Date of Patent: Jan. 26, 1999

[54] FAULT BLOCK DETECTING SYSTEM USING ABNORMAL CURRENT AND ABNORMAL DATA OUTPUT

[75] Inventor: Masaru Sanada, Tokyo, Japan

[73] Assignee: NEC Corporation, Tokyo, Japan

[21] Appl. No.: 970,537

[22] Filed: Nov. 14, 1997

Related U.S. Application Data

[63] Continuation of Ser. No. 861,782, May 22, 1997, abandoned, which is a continuation of Ser. No. 612,825, Mar. 11, 1996, abandoned.

[30] Foreign Application Priority Data

Mar. 10, 1995 [JP] Japan .................................... 7-051590
Apr. 28, 1995 [JP] Japan .................................... 7-129769

[51] Int. Cl.$^6$ ...................................................... S06F 11/00
[52] U.S. Cl. .......................................... 371/25.1; 324/765
[58] Field of Search .................................. 371/25.1, 22.1, 371/21.6, 28; 395/183.01; 364/489, 550; 324/500, 765, 528

[56] References Cited

U.S. PATENT DOCUMENTS 5,321,354  6/1994  Ooshima ................................. 324/765
5,392,283  2/1995  Hsue ...................................... 371/15.1
5,449,960  9/1995  Ohi et al. ................................. 327/94
5,467,035  11/1995 Ohi et al. ................................. 327/94

OTHER PUBLICATIONS

M. Sanada, "New Applicaton of Laser Beam to Failure Analysis of LSI with Multi–Metal Layers", Microelectron. Reliab., vol. 33, No. 7, pp. 993–1009, 1993.

M. Sanada, "Evalution and Detection of CMOS–LSI with Abnormal IDD2", Microelectron. Reliab., vol. 35, No. 3, pp. 619–629, 1995.

Primary Examiner—Robert W. Beausoliel, Jr.
Assistant Examiner—Nadeem Iqbac
Attorney, Agent, or Firm—Foley & Lardner

[57] ABSTRACT

In a semiconductor device formed by a plurality of logic blocks, plurality of functional test patterns are generated and transmitted to the semiconductor device. If an abnormal current is detected upon receipt of an i-th functional test pattern, and an output data is different from an expected data upon receipt of a j-th functional test pattern, a fault block is determined in accordance with the i-th functional test pattern and the j-th functional test pattern.

6 Claims, 28 Drawing Sheets

| IN1 | IN2 | OUT |
|---|---|---|
| L | L | H |
| L | H | L |
| H | L | L |
| H | H | L |

| IN1 | IN2 | OUT |
|---|---|---|
| L | L | ABNORMAL ($V_{DD}/3$) |
| L | H | L |
| H | L | L |
| H | H | L |

Fig. 5

| FTP(ADD) | OPERABLE BLOCKS |
|---|---|
| FTP(0) | $B_1$, $B_3$, $B_6$, $B_a$, $B_f$ — — — , $B_z$ |
| FTP(1) | $B_3$, $B_f$, $B_g$, $B_h$, $B_k$ — — — , $B_y$ |
| FTP(2) | $B_1$, $B_3$, $B_6$, $B_a$, $B_c$, — — — , $B_x$ |
| FTP(MAX) | $B_3$, $B_6$, $B_8$, $B_9$, $B_a$, — — — , $B_z$ |

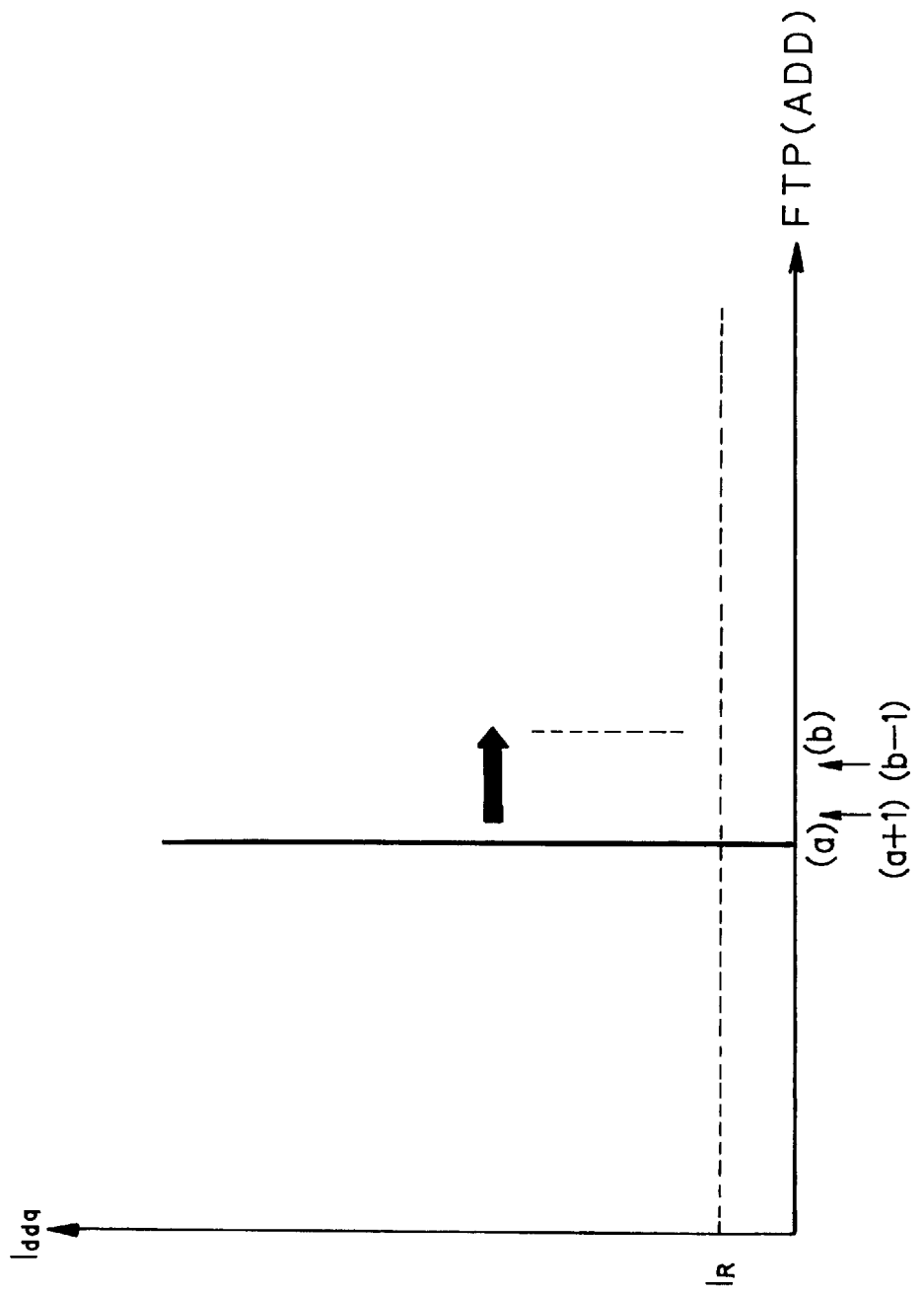

☐ TRANSITION BLOCK

☒ TRANSITION BLOCK INCLUDING FAULT POINT

☐ TRANSITION BLOCK

◸ TRANSITION BLOCK INCLUDING FAULT POINT

△ BLOCKS RELATED TO PIN $P_b$

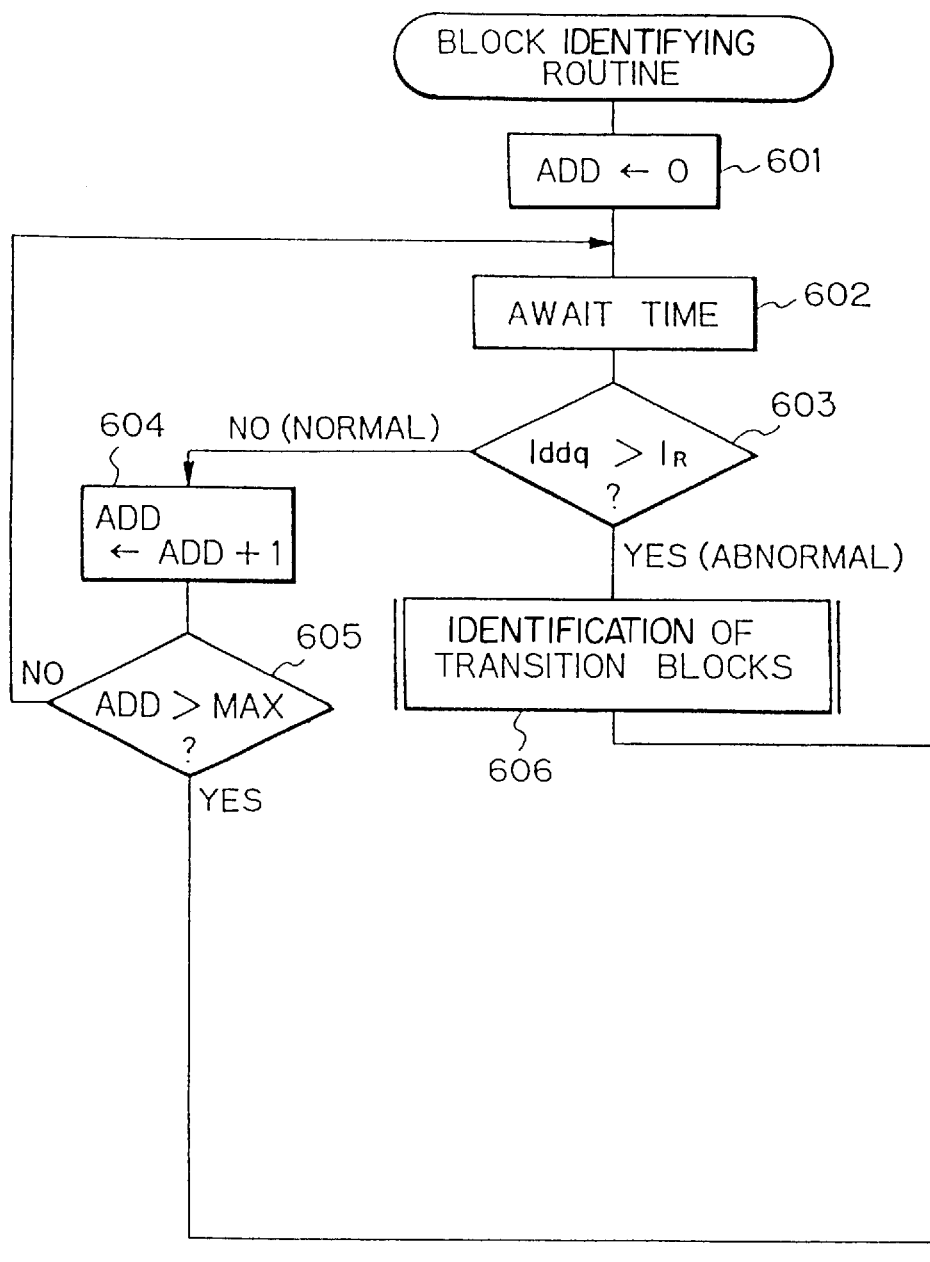

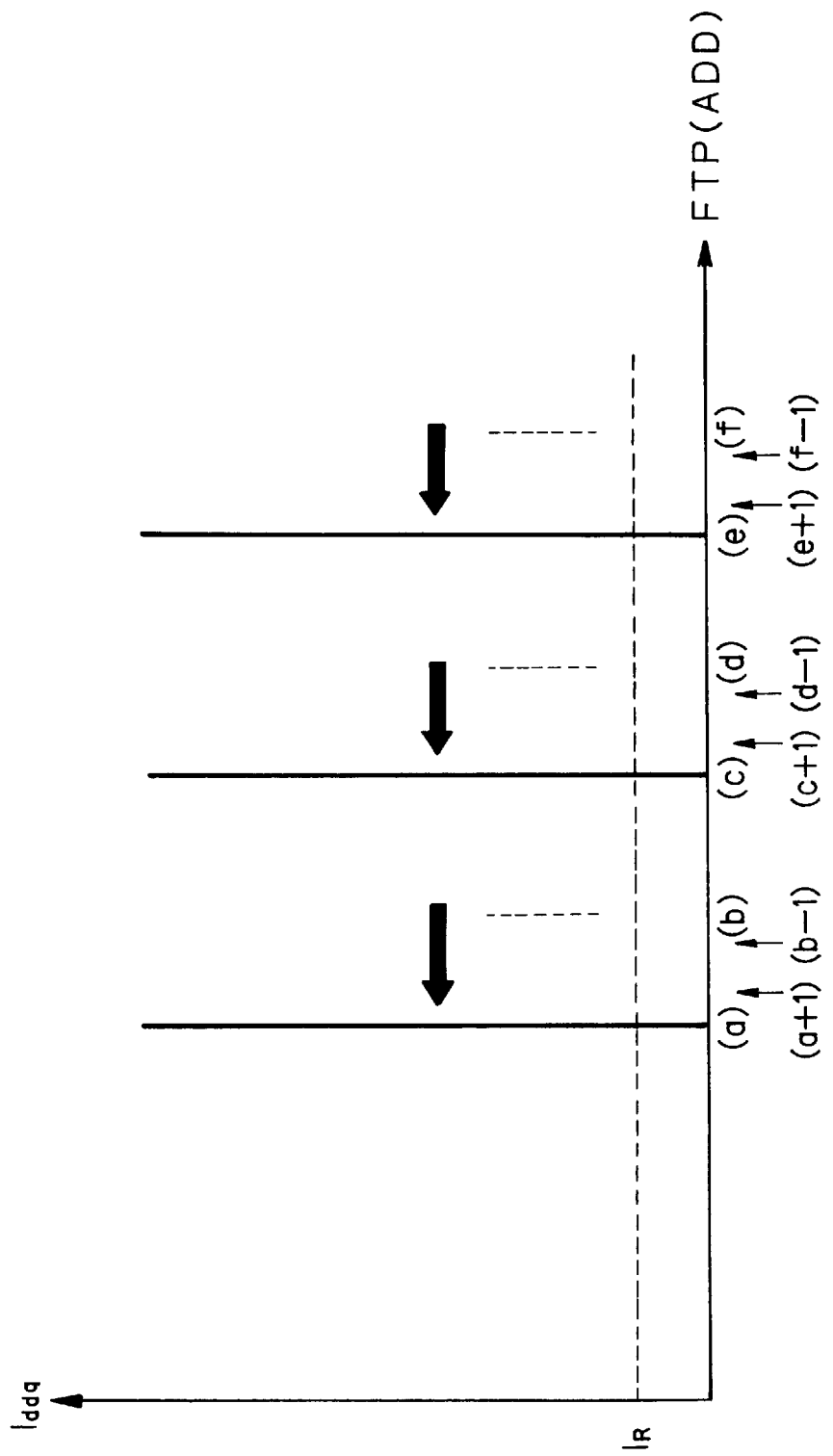

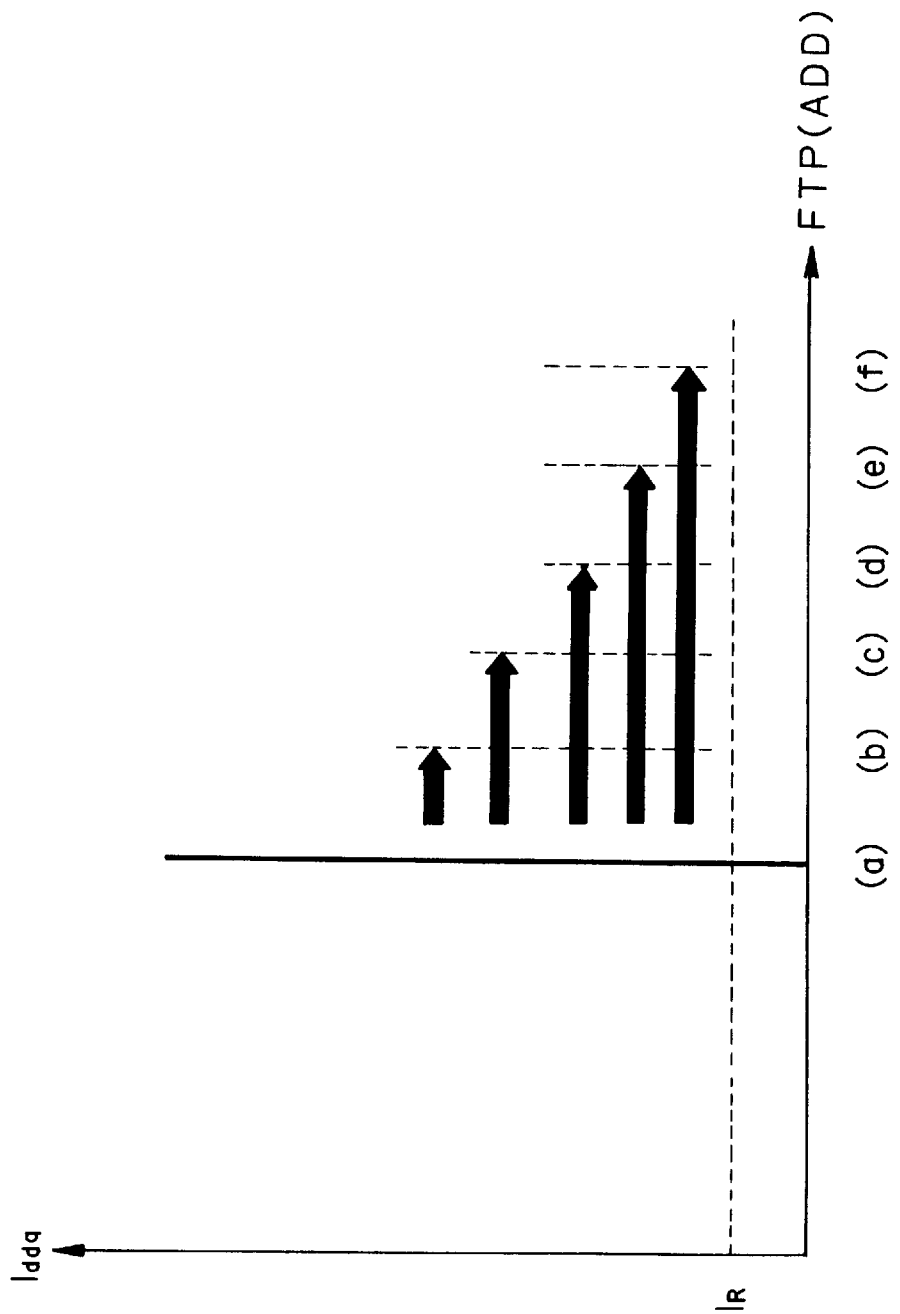

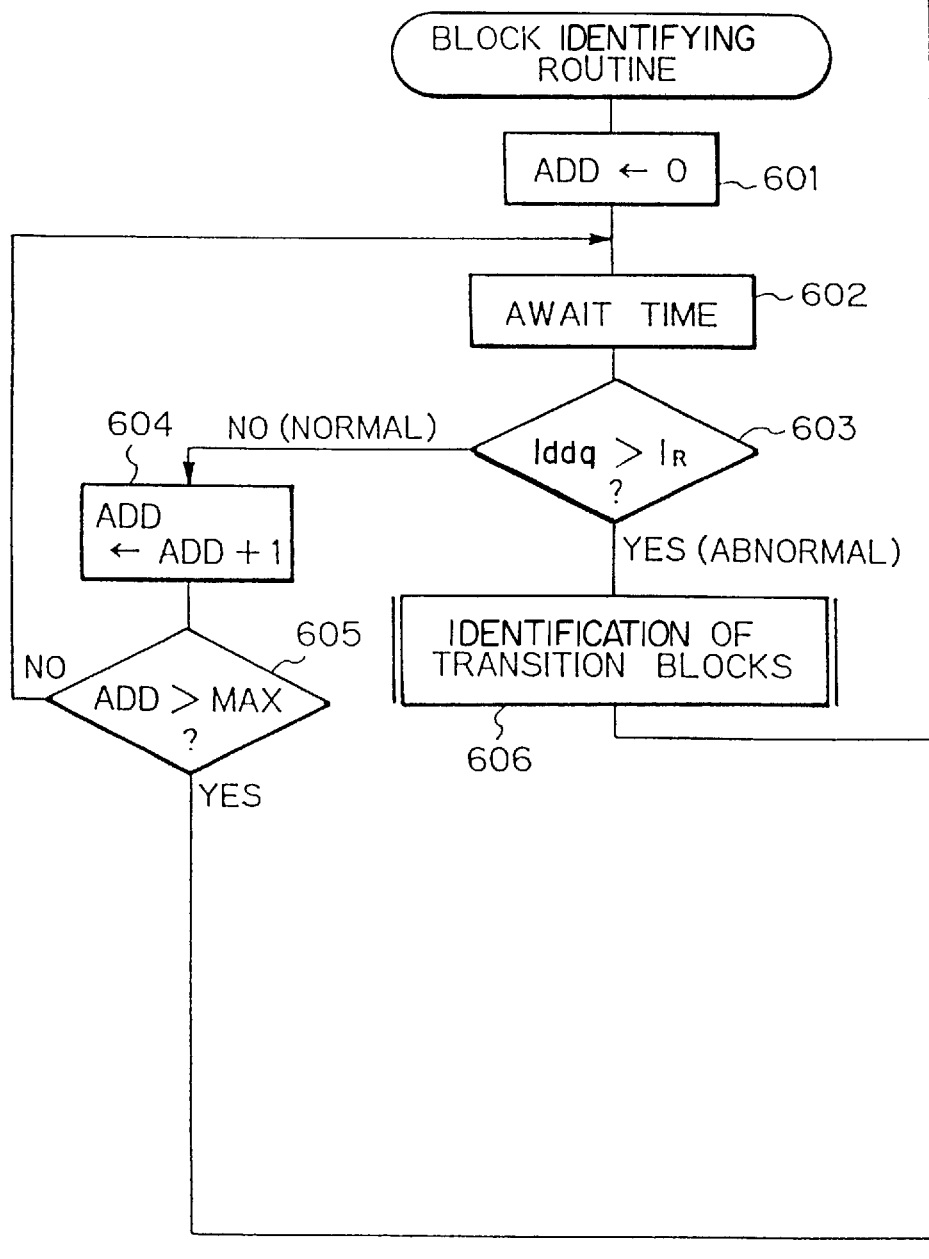

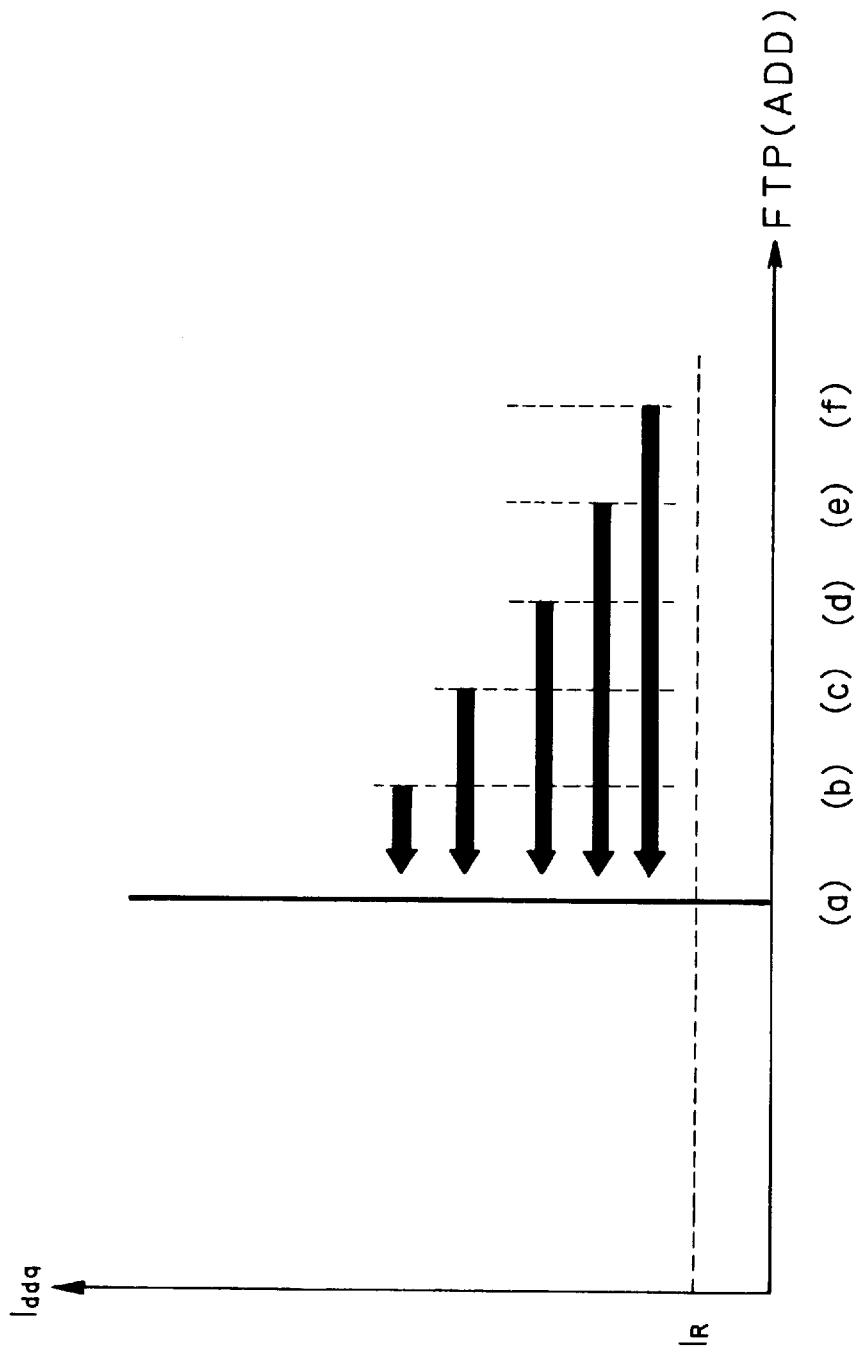

☐ TRANSITION BLOCK
[B] BLOCK RELATED TO PIN $P_b$
[C] BLOCK RELATED TO PIN $P_c$
[D] BLOCK RELATED TO PIN $P_d$
[E] BLOCK RELATED TO PIN $P_e$
[F] BLOCK RELATED TO PIN $P_f$

FAULT BLOCK DETECTING SYSTEM USING ABNORMAL CURRENT AND ABNORMAL DATA OUTPUT This application is a continuation of application Ser. No. 08/861,782 filed May 22, 1997, now abandoned, which is a continuation of application Ser. No. 08/612,825, filed Mar. 11, 1996, abandoned.

BACKGROUND OF THE INVENTION

1. Field of the Invention

The present invention relates to a system for detecting a fault block in a semiconductor device such as a CMOS device formed by a plurality of logic blocks.

2. Description of the Related Art

In a prior art system for testing a semiconductor device, the device is driven using a functional test pattern, and as a result, an output pattern is obtained at the outputs of the device. Then, the output pattern is compared with an expected pattern. Thus, a determination of whether the device is normal or abnormal is made based on whether the output pattern coincides with the expected pattern.

After it is determined that the device is abnormal, a fault point is estimated in accordance with a fault dictionary for storing a relationship between functional test patterns and output patterns for virtual faults.

The fault dictionary is made by carrying out fault simulation.

In the above-described prior art testing apparatus, however, when the device is highly-integrated, a large number of fault simulations are required to complete the fault dictionary.

In addition, the volume of the fault dictionary is very large. For example, $$V_0 \propto L^{2-3}$$

where $V_0$ is the volume of the fault dictionary; and
L is a number of logic circuits in the device.
Thus, it is extremely difficult to determine a fault point of a highly-integrated semiconductor device.

SUMMARY OF THE INVENTION

It is an object of the present invention to be able to effectively determine a fault point of a highly-integrated semiconductor device.

According to the present invention, in a semiconductor device formed by a plurality of logic blocks, a plurality of functional test patterns are generated and used to drive the semiconductor device. If an abnormal current is detected upon driving with an i-th functional test pattern, and an output data is different from an expected data upon driving with a j-th (j>i) functional test pattern, a fault block is determined in accordance with the i-th functional test pattern and the j-th functional test pattern.

After the fault block is determined, a fault point within the fault block is estimated by the prior art testing system. In this case, the prior art testing system does not need a large fault dictionary.

BRIEF DESCRIPTION OF THE DRAWINGS

The present invention will be more clearly understood from the description as set forth below, in comparison with the prior art, with reference to the accompanying drawings, wherein:

FIG. 5 is a table showing a relationship between functional test patterns and operable blocks;

FIG. 7 is a quiescent $V_{DD}$ supply current ($I_{qqd}$) diagram for explaining the flowchart of FIG. 6;

FIGS. 14A and 14B are flowcharts showing a modification of the routine of FIG. 9;

FIG. 15 is a quiescent $V_{DD}$ supply current ($I_{qqd}$) diagram for explaining the flowchart of FIG. 14;

FIG. 17 is a quiescent VDD supply current ($I_{qqd}$) diagram for explaining the flowchart of FIG. 16;

FIGS. 19A and 19B are flowcharts showing another modification of the routine of FIG. 9;

FIG. 20 is a quiescent $V_{DD}$ supply current ($I_{qqd}$) diagram for explaining the flowchart of FIG. 19;

DESCRIPTION OF THE PREFERR EMBODIMENT

First, a principle of the present invention will be explained with reference to FIGS. 1A, 1B, 2A, 2B and 3.

Figures 1A, 1B:
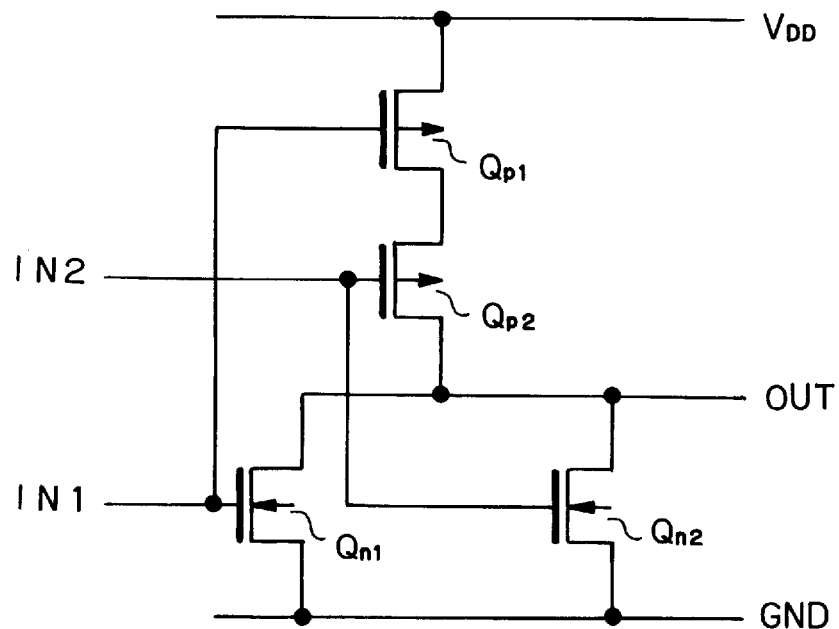
FIG. 1A is a circuit diagram illustrating a normal two-input CMOS NOR circuit.
FIG. 1B is a truth table of the NOR circuit of FIG. 1A.

In FIG. 1A, which illustrates a normal two-input CMOS NOR circuit, P-channel MOS transistors $Q_{p1}$ and $Q_{p2}$ are connected in series between a power supply terminal $V_{DD}$) and an output terminal OUT, and N-channel MOS transistors $Q_{n1}$ and $Q_{n2}$ are connected in parallel between the output terminal OUT and a ground terminal GND. The transistors $Q_{p1}$ and $Q_{n1}$, are controlled by the voltage of an input terminal IN1, and the transistors $Q_{p2}$ and $Q_{n2}$ are controlled by the voltage of an input terminal IN2. The truth table of the NOR circuit of FIG. 1A is shown in FIG. 1B.

In FIG. 1A, there is not a quiescent $V_{DD}$ supply current $I_{ddq}$, flowing from the power supply terminal $V_{DD}$ to the ground terminal GND. That is, the quiescent $V_{DD}$ supply current $I_{ddq}$ is in a normal state.

Figures 2A, 2B:
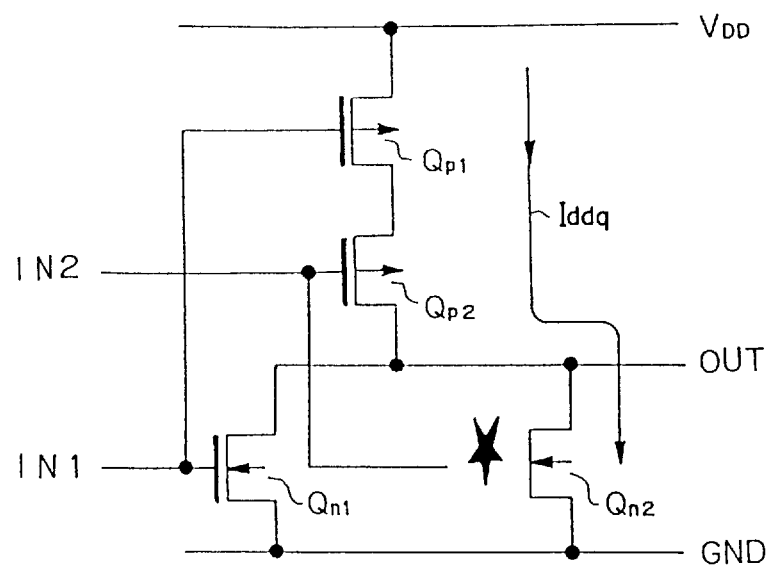
FIG. 2A is a circuit diagram illustrating an abnormal two-input CMOS NOR circuit.
FIG. 2B is a truth table of the NOR circuit of FIG. 2A.

In FIG. 2A, which illustrates an abnormal two-input CMOS NOR circuit, assume that the gate of the N-channel transistor $Q_{n2}$ is open, so that the N-channel transistor $Q_{n2}$ is in a normally ON state. As a result, when the voltages at the input terminals IN1 and IN2 are both low, a penetration current, i.e., a large quiescent $V_{DD}$ supply current $I_{qqd}$ flows. That is, the quiescent $V_{DD}$ supply current $I_{qqd}$ is in an abnormal state.

Also, in FIG. 2k, when the voltages at the input terminals IN1 and IN2 are both low, the voltage $V_{out}$ at the output terminal OUT is $$V_{OUT} = V_{DD} (Z_n)/(2 \cdot Z_p + Z_n)$$

where $Z_p$ is an impedance of the P-channel transistor $Q_{p2}$;

$Z_n$ is an impedance of each of the N-channel transistors $Q_{n1}$ and $Q_{n2}$; and $V_{th}$ is a logic threshold voltage of a CMOS inverter. If $Z_p = Z_n$, then $V_{out}$ (⅓)$V_{pp} < V_{th}$ Therefore, the truth table of the NOR circuit of FIG. 2A is shown in FIG. 2B.

Thus, generally, if a semiconductor device such as a CMOS device has a physical defect therein, an abnormal quiescent $V_{DD}$ supply current flows there-through (see; M. Sanada, "New Application of Laser Beam to Failure Analysis of LSI with Multi-Metal Layers", Microelectronics and Reliability, Vol. 33, No. 7, pp. 993–1009, 1993, and M. Sanada, "Evalution and Detection of CMOS-LSI with Abnormal IDDQ", Microelectronics and Reliability, Vol. 35, No. 3, pp. 619–629, 1995).

Figure 3:
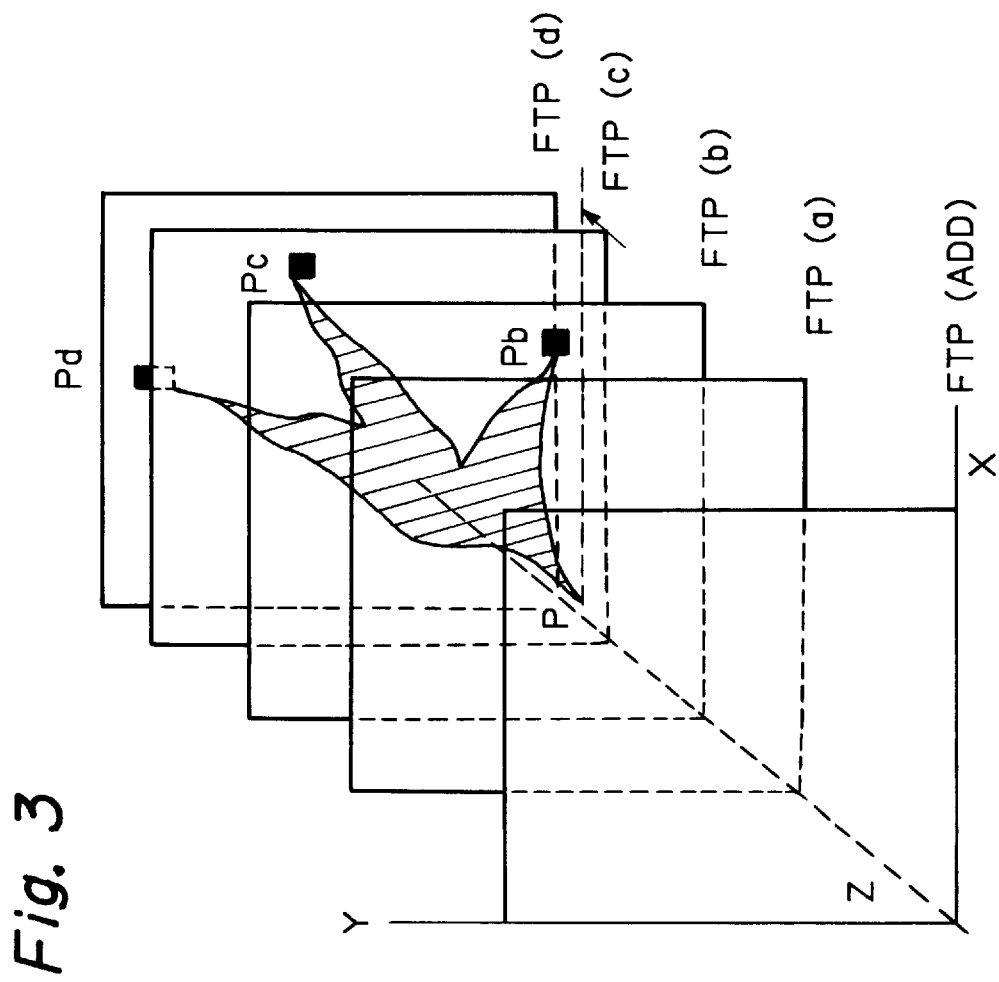
FIG. 3 is a three-dimensional diagram illustrating a signal propagation from a fault point to output data pins.

In FIG. 3, which illustrates a three-dimensional diagram showing a fault propagation from a fault point to data output pins, a rectangle depicted on an X–Y plane designates a semiconductor device (chip), and the rectangle transits along a Z-axis which shows a change of a functional test pattern BrP (ADD). That is, when a functional test pattern FTA (a) is applied to the semiconductor device, a quiescent VD supply current $I_{qqd}$ is detected. In this case, assume that such a quiescent $V_{DD}$ supply current is derived from a fault point (or block) P. Then, when the functional test pattern FTP advances, fault information derived from the fault point P propagates through the semiconductor device. As a result, when a functional test pattern FTP (b) is applied to the semiconductor device, the fault information reaches an output data pin $P_b$. This can be detected by comparing data at the output data pin $P_b$ with its expected data. Also, when a functional test pattern FTP (c) is applied to the semiconductor device, the fault information reaches an output data pin $P_c$. This can be detected by comparing data at the output data pin $P_c$ with its expected data. Further, when a functional test pattern ETP (d) is applied to the semiconductor device, the fault information reaches an output data pin $P_d$. This can be detected by comparing data at the output data pin $P_d$ with its expected data.

In the present invention, a fault point (block) is determined from blocks related to the functional test pattern FTP (a) and blocks related to the functional test pattern FTP (b), FTP (c) or ETP (d).

Figure 4:
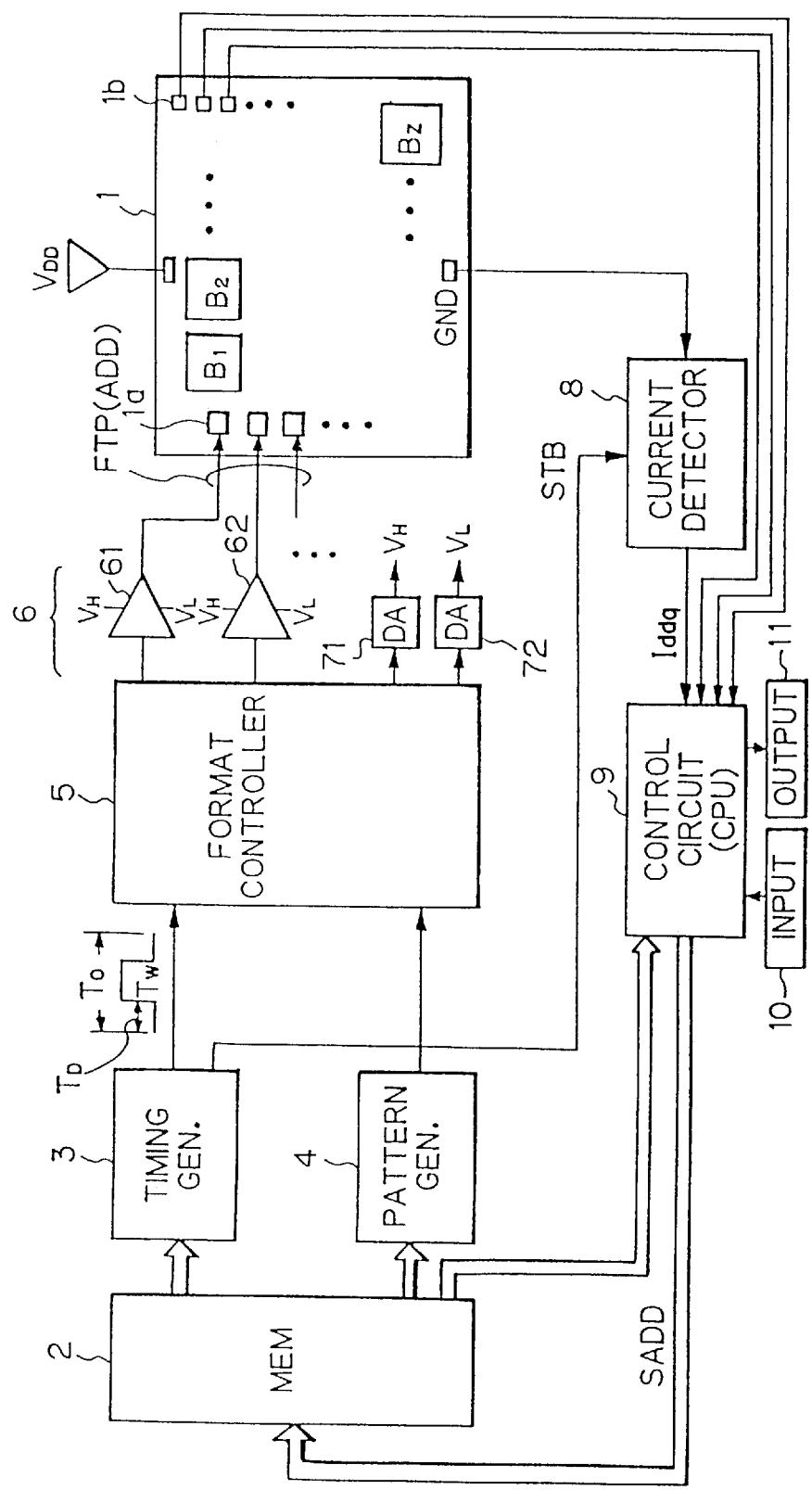
FIG. 4 is a block circuit diagram illustrating an embodiment of a fault block detecting apparatus according to the present invention.

In FIG. 4 illustrates an embodiment of semiconductor device such as a CMOS LSI device including a plurality of logic blocks B1, B2, . . . $B_z$. Data input pins 1a of the semiconductor device 1 are supplied with a functional test pattern (FTP). The functional test pattern is generated by a memory 2, a timing generating circuit 3, a pattern generating circuit 4, a format controller 5, and PIN electronics units 61, 62, . . . connected to input pads of the semiconductor device 1.

The timing generating circuit 3 generates a timing signal for defining a test rate TO, a delay time $T_D$ and a pulse width $T_w$. Also, the timing generating circuit 3 generates a strobe signal STB and transmits it to a current detector 8 for detecting a quiescent $V_{DD}$ supply current $I_{qqd}$ flowing from a power supply terminal $V_{DD}$ to a ground terminal GND in the semiconductor device 1.

The pattern generating circuit 4 generates a test pattern signal in accordance with data read out of the memory 2, which data is generally compressed.

Each of the PIN electronics units 61, 62, . . . is powered by voltages $V_m$ and $V_L$ which are generated by digital/analog (D/A) converters 71 and 72, respectively. For example, when "0" is supplied to the PIN electronics unit 61, the voltage $V_L$ (=0V) is applied to the corresponding input pad. When "1" is supplied to the PIN electronics unit 61, the voltage $V_H$ is applied to the corresponding input pad.

The memory 2 receives an address signal SADD from a control circuit 9 which is comprised of a central processing unit (CPU), ROMs, RAMs, and the like. Therefore, if the content ADD of the address signal SADD is incremented by the control circuit 9, functional test patterns are sequentially generated and transmitted to the semiconductor device 1.

Simultaneously, the control circuit 9 monitors a quiescent $V_{DD}$ supply current $I_{qqd}$ flowing through the semiconductor device 1 by the current detector 8.

Also, the control circuit 9 compares output data at data output pins 1b with expected data from the memory 2.

Further, connected to the control circuit 9 are an input apparatus 10 such as a keyboard or other controllers, and an output apparatus 11 such as a CRT.

Stored in the RAM of the control circuit 9 is a table showing a relationship between functional test patterns FTP (ADD) and operable blocks operated by the functional test patterns FTP (ADD) as shown in FIG. 5. Note that such blocks are designed by using application specific integrated circuit (ASIC) technology such as gate array technology, and therefore, the above-mentioned relationship can be recognized in advance.

Figure 6A:
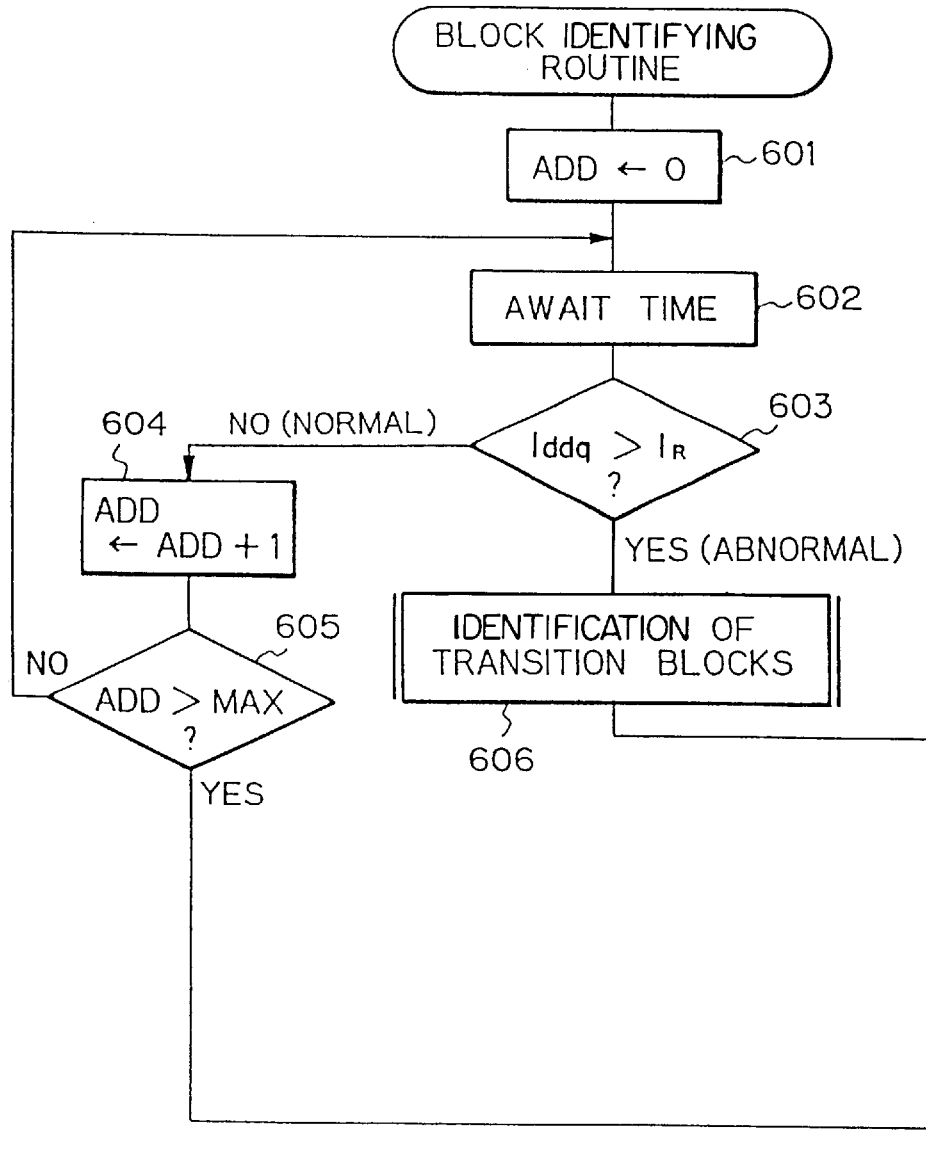
FIGS. 6A and 6B are flowcharts showing a first operation of the control circuit of FIG. 4.
Figure 6B:
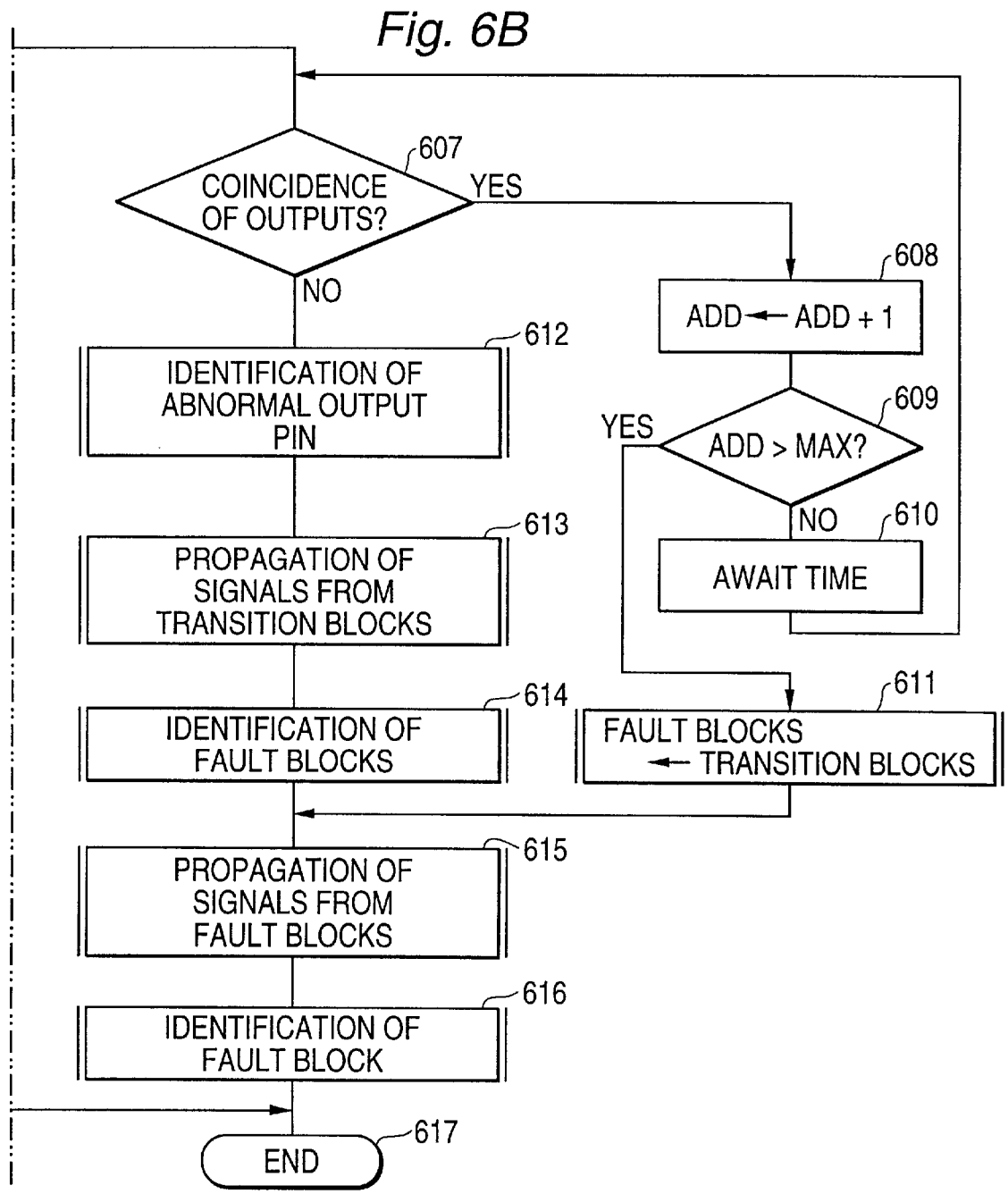
Figure 8:
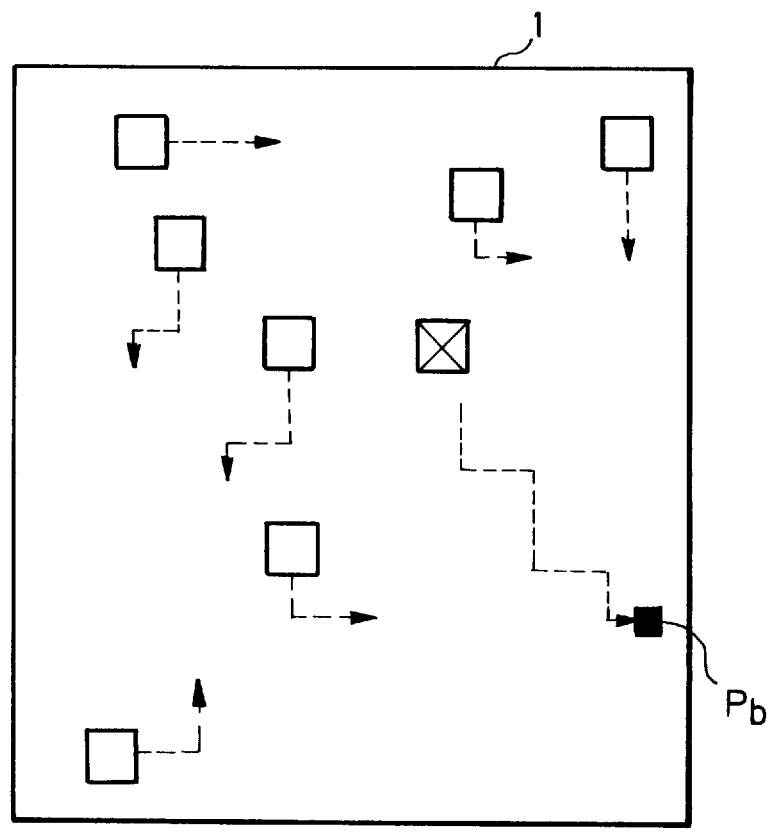
FIG. 8 is a layout diagram of the semiconductor device of FIG. 4 for explaining the operation of the flowchart of FIG. 6.

FIGS. 6A and 6B show a first operation of the control circuit 9, FIG. 7 is a quiescent $V_{DD}$ supply current diagram for explaining the routine of FIG. 6, and FIG. 8 is a layout diagram for explaining the routine of FIG. 6.

First, at step 601, the address ADD is cleared.

Step 602 waits for a predetermined time period to pass, so that the semiconductor device 1 responds to the functional test pattern ETP of the address ADD to obtain a stable quiescent $V_{DD}$ supply current $I_{qqd}$. After the predetermined time has passed, the control proceeds to step 603.

At step 603, it is determined whether $I_{qqd} > I_R$ (definite value) is satisfied. If $I_{qqd} \leq I_R$, which means that the quiescent $V_{DD}$ supply current $I_{qqd}$ is normal, the control proceeds to steps 604 and 605. On the other hand, if $I_{qqd} > I_R$, which means that the quiescent $V_{DD}$ supply current $I_{qqd}$ is abnormal, the control proceeds to step 606.

Steps 604 and 605 repeat the operation at steps 602 and 603 until ADD reaches its maximum value MAX. When ADD reaches MAX at step 605, the control proceeds directly to step 617.

Initially, as shown in FIG. 7, the quiescent $V_{DD}$ supply current $I_{qqd}$ is usually normal ($I_{qqd} \leq I_R$) Therefore, if $I_{qqd} > I_R$ at ADD=a as shown in FIG. 7, this means that the quiescent $V_{DD}$ supply current $I_{qqd}$ is switched from normal to abnormal. Therefore, at step 606, transition blocks, which are the blocks which are not tested by between the functional test pattern FTP (a-1) but are tested by the functional test pattern FTP (a), are identified with reference to the table as shown in FIG. 5, since the fault point must exist in one or more of the transition blocks. In this case, the transition blocks are as shown in FIG. 8. Then, the control proceeds to step 607

At step 607, it is determined whether output data at the data output pins 1b are the same as the expected data stored in the memory 2. If the output data at the data output pins 1b are the same as the expected data, the control proceeds to steps 608, 609 and 610 which repeat the operation at step 607 until ADD reaches MAX. When ADD reaches MAX at step 609, the control proceeds via step 611 to step 615. Note that, at step 611, all the transition blocks identified at step 606 are deemed to include fault points.

On the other hand, if the output data are different from the expected data, at ADD=b as shown in FIG. 7, the control proceeds from step 607 to step 612.

At step 612, an abnormal data output pin which is an output pin which outputs data which does not conform to he expected data, such as $P_b$ of the data output pins 1b as shown in FIG. 8 ,is identifined.

Next, at step 613, the output signals of the identified transition blocks are propagated or traced by a logic simulation or circuit arrangement infomation while the functional test patterns FTP (a), FTP (a+1), . . . , FTP (b-1) and FTP (b) as shown in FIG. 7 are sequentially applied to the semiconductor device 1.

Next, at step 614, a fault block is identified from among the identified transition blocks. That is, one or more of the transition blocks as shown in FIG. 8 whose output signals reached the data output pin $P_b$ are identified as fault blocks. In FIG. 8, only one block is identified as a fault block; however, two or more blocks may be identified as fault blocks.

At step 615, the output signals of the fault blocks are defined to be "1" (high) or "0" (low). Then, the output signals of the fault blocks are propagated by a logic simulation or circuit arrangement infomation while the functional test patterns FTP (a), ETP (a+1), . . . , FTP (b-1) and FTP (b) are sequentially applied to the semiconductor device 1.

Next, at step 616, a similar identification process to that at step 614 is carried out. That is, only one fault block whose defined output signal reached the data output pin $P_b$ may be identified.

Then, the routine of FIG. 6 is completed by step 617.

Figure 9A:
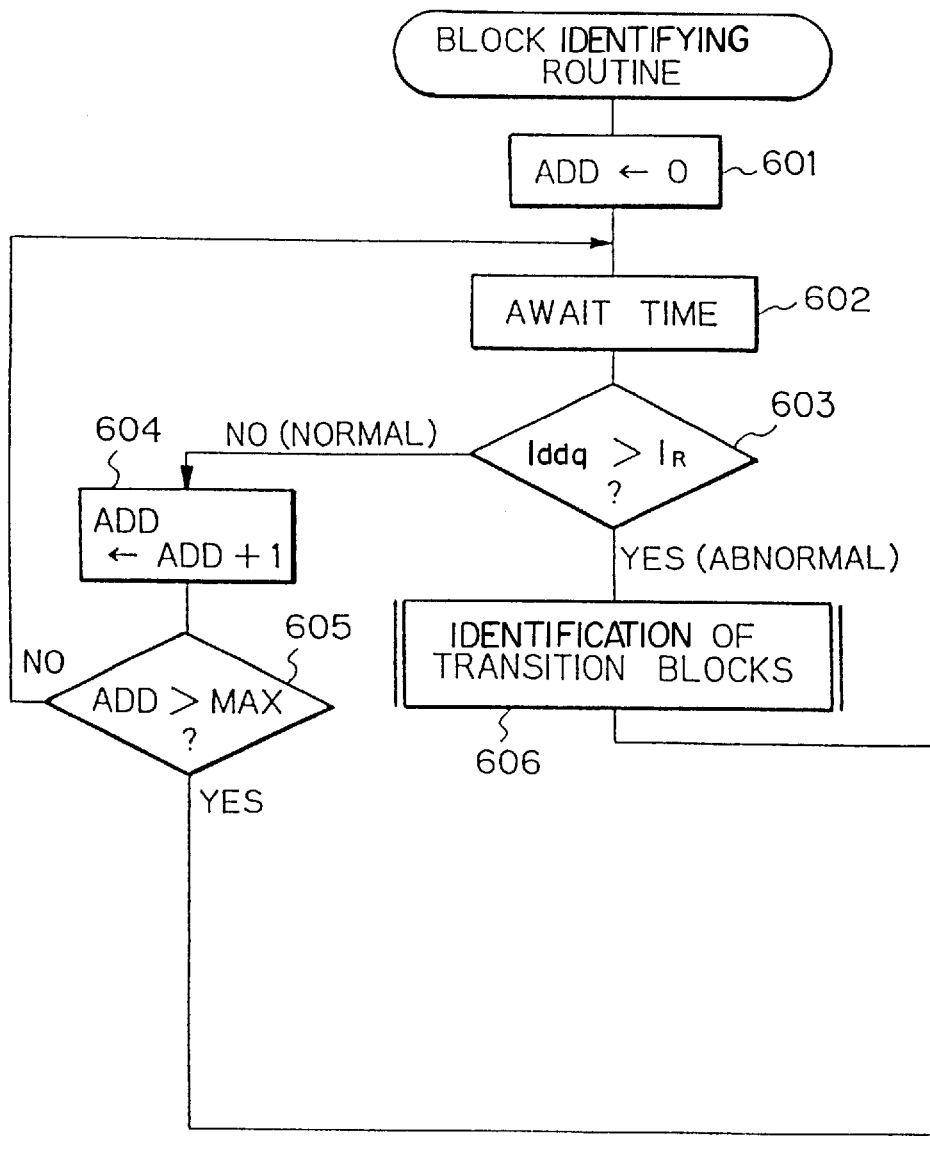
FIGS. 9A and 9B are flowcharts showing a second operation of the control circuit of FIG. 4.
Figure 9B:
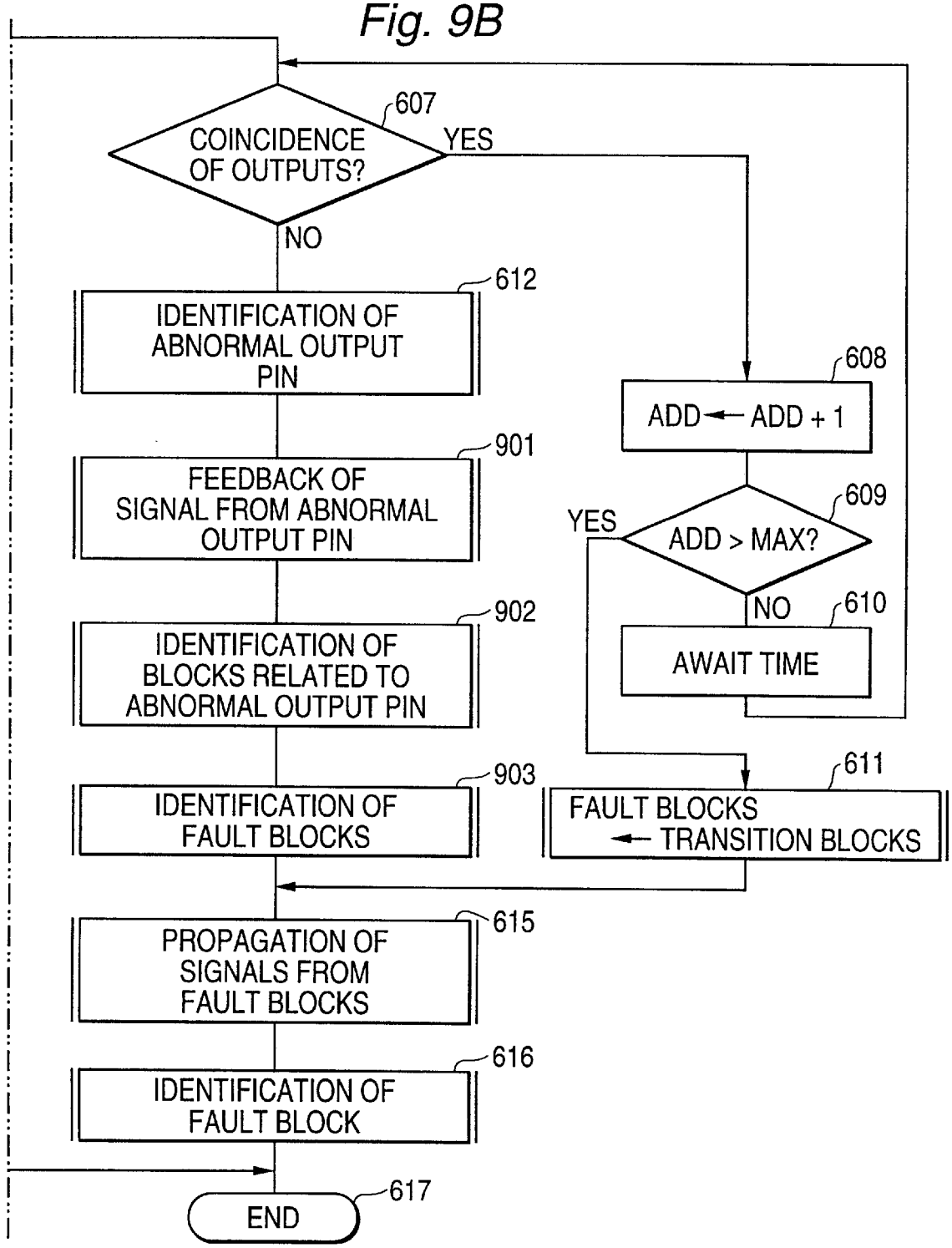
Figure 10:
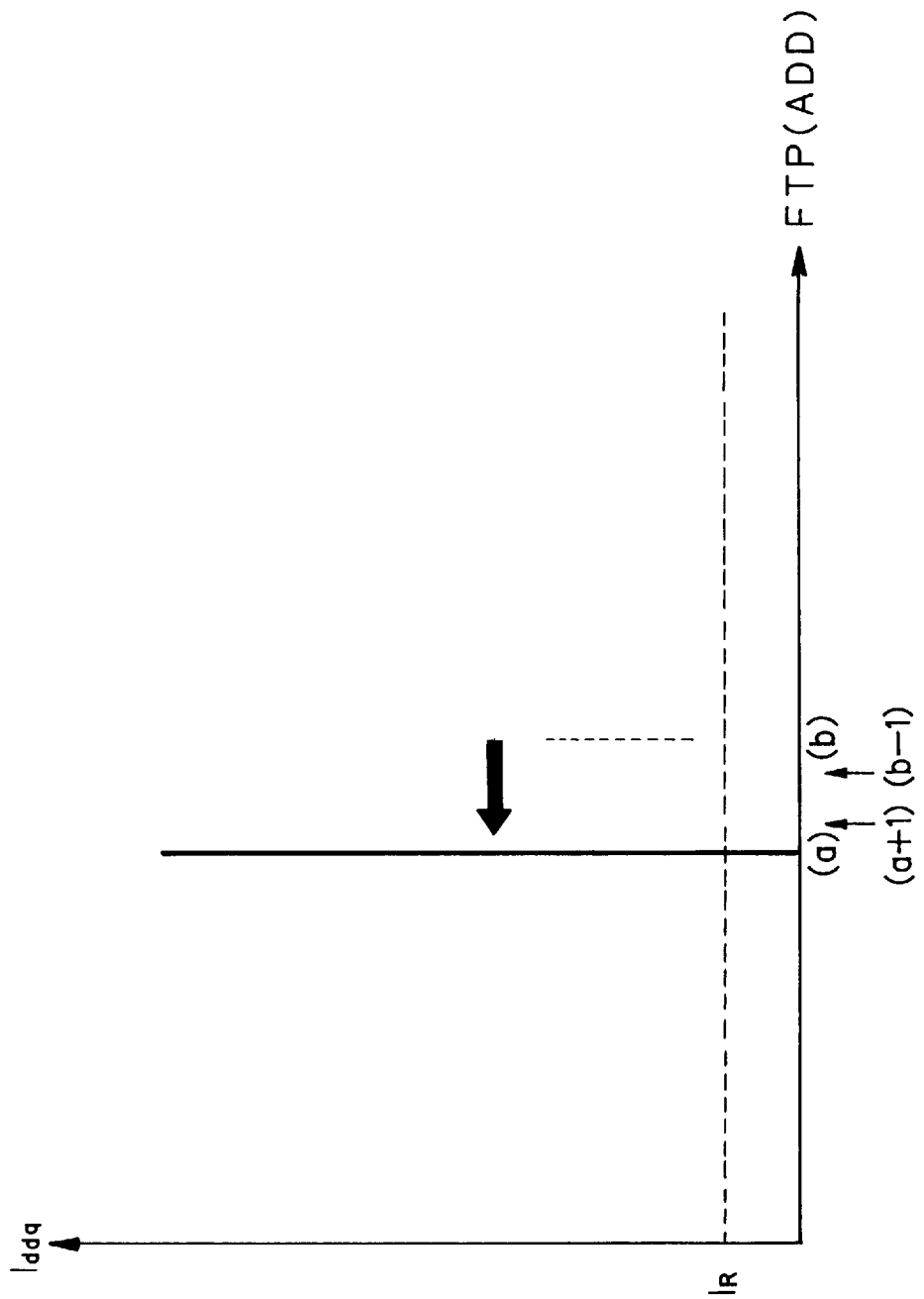
FIG. 10 is a quiescent $V_{DD}$ supply current ($I_{qqd}$) diagram for explaining the flowchart of FIG. 9.
Figure 11:
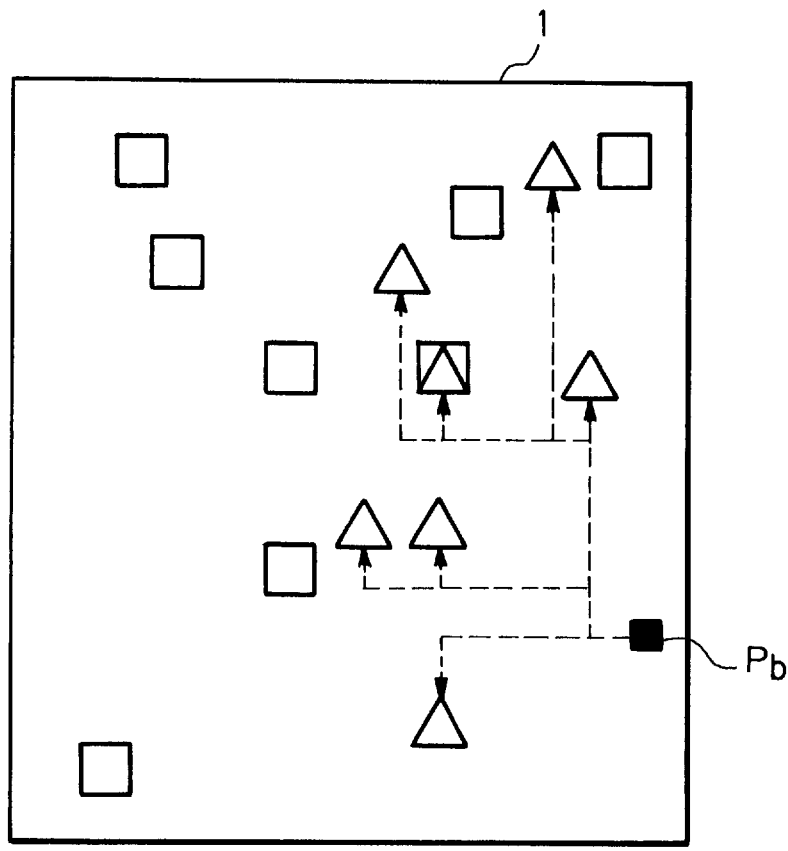
FIG. 11 is a layout diagram of the semiconductor device of FIG. 4 for explaining the operation of the flowchart of FIG. 9.

FIGS. 9A and 9B show a second operation of the control circuit 9, FIG. 10 is a quiescent $V_{DD}$ supply current diagram for explaining the routing of FIG. 9, and FIG. 11 is a layout diagram for explaining the routine of FIG. 6.

In FIG. 9, steps 901, 902 and 903 are provided instead of step 613 and 614 of FIG. 6.

The control at step 612 proceeds to step 901. At step 901, the output signal at the data output pin $P_b$ as shown in FIG. 11 is fed back or traced by a logic simulation or circuit arrangement infomation while the functional test patterns FTP (b). FTP (b-1), . . . , FTP (a+1) and FTP (a) as shown in FIG. 10 are sequentially applied to the semiconductor device 1.

Next, at step 902, blocks related to the data output pin $P_b$ as shown in FIG. 11 are identified.

Next, at step 903, a common block i.e., a block shared in common between the identified transition blocks and the blocks related to the data output pin $P_b$, is identified as a fault block. Also, in this case, in FIG. 11, only one block is identified as a fault block; however, two or more blocks may be identified as fault blocks.

Then, the control proceeds to step 615.

Figure 12A:
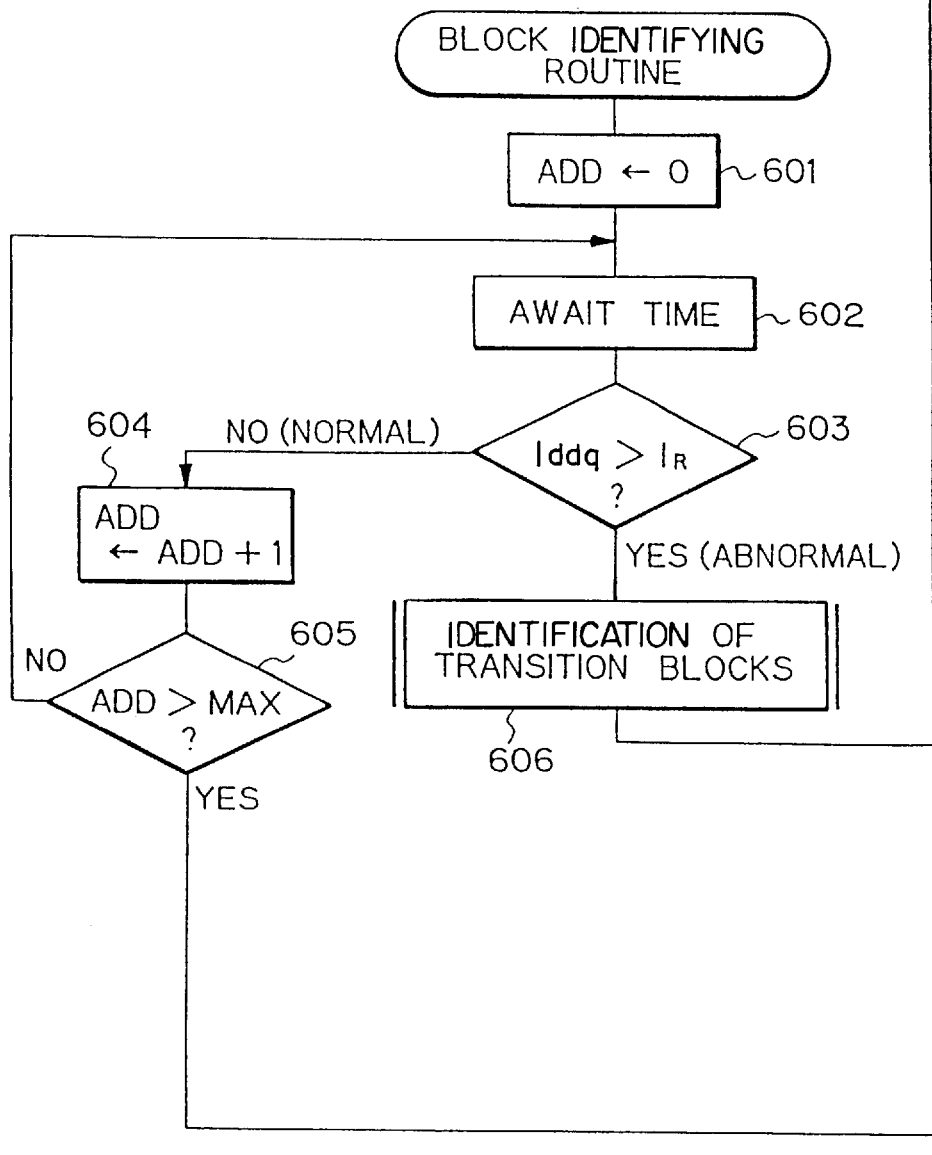
FIGS. 12A and 12B are flowcharts showing a modification of the routine of FIG. 6.
Figure 12B:
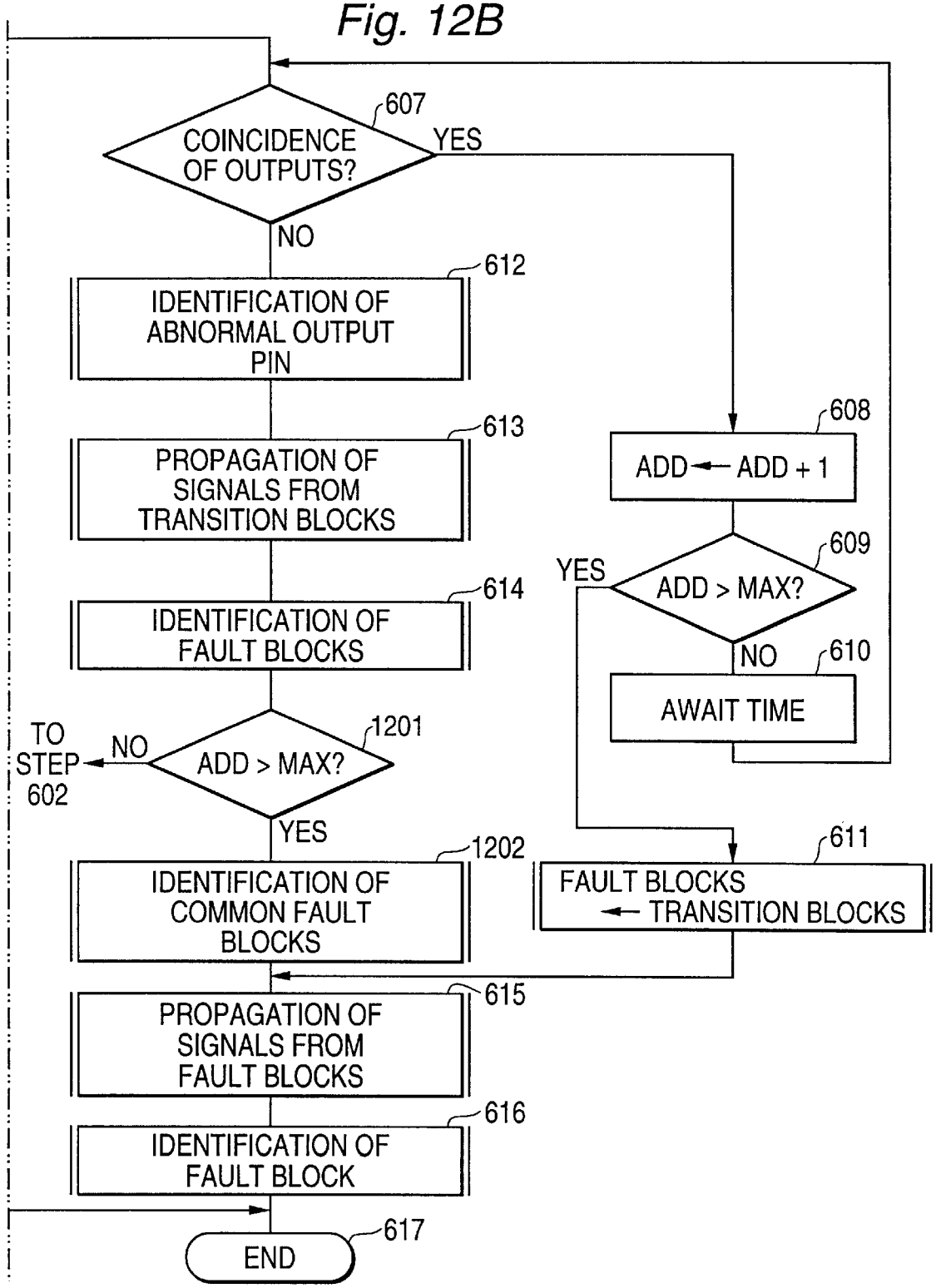
Figure 13:
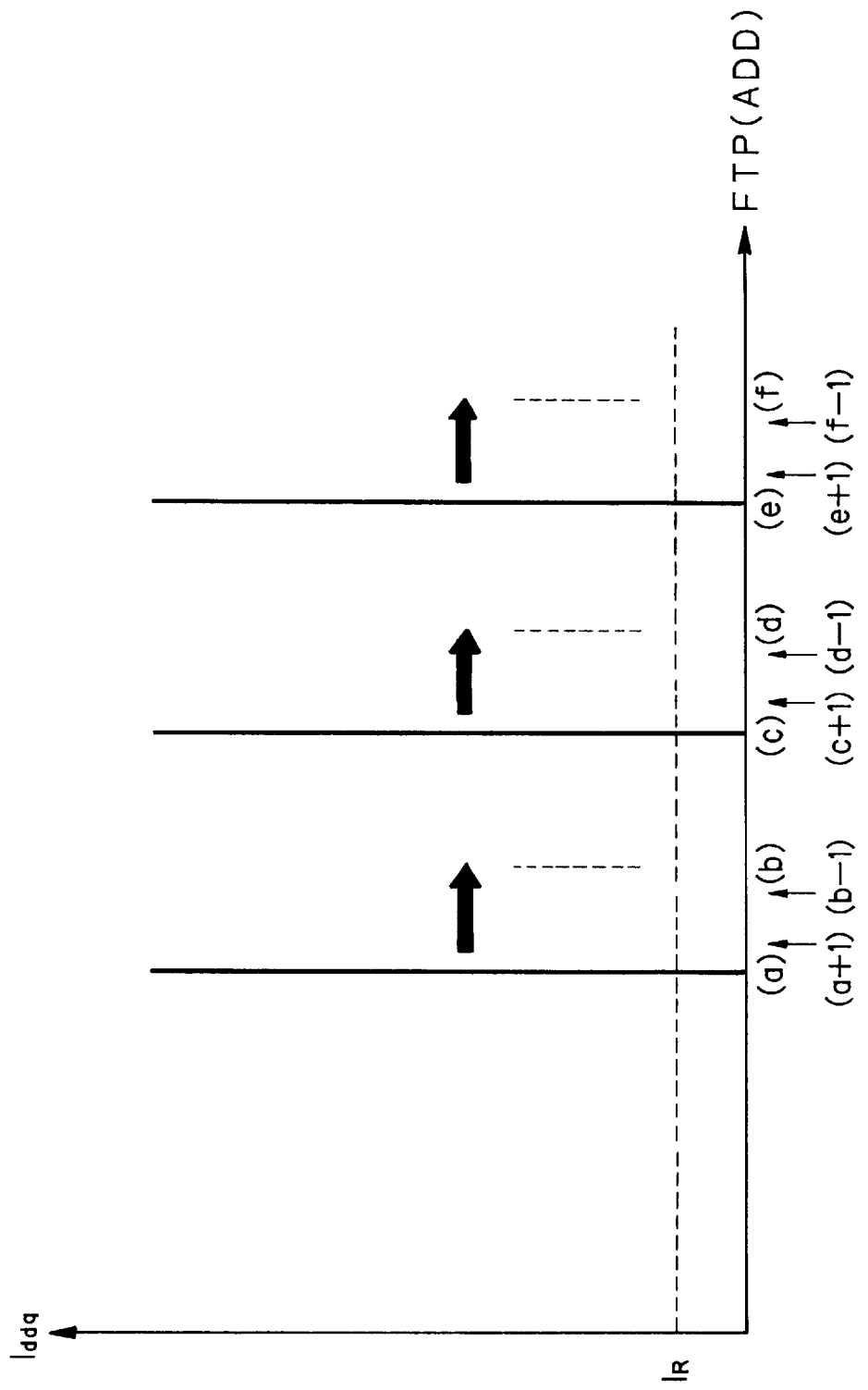
FIG. 13 is a quiescent $V_{DD}$ supply current $I_{qqd}$) diagram for explaining the flowchart of FIG. 12.

In FIGS. 12A and 12B, which illustrate a modification of the routine of FIG. 6, steps 1201 and 1202 are added to the routine of FIG. 6. As a result, the operation for identifying transition blocks at steps 603 and 606 and the operation for identifying fault blocks at steps 612 to 614 can be carried out by step 1201 a plurality of times. For example, as shown in FIG. 13, first fault blocks are identified by comparing transition blocks at FTP (a) and blocks related to an abnormal data output pin determined at ETP (b), second fault blocks are identified by comparing transition blocks at FTP (c) and blocks related to an abnormal data output pin determined at FTP (d), and third fault blocks are identified by comparing transition blocks at FTP (e) and blocks related to an abnormal data output pin determined at FTP (f). Next, at step 1202, common fault blocks among the first fault blocks, the second fault blocks and the third fault blocks are identified. In this case, the number of the common fault blocks is not larger than any one of the number of the first fault blocks, the number of second fault blocks or the number of third fault blocks.

Figure 14B:
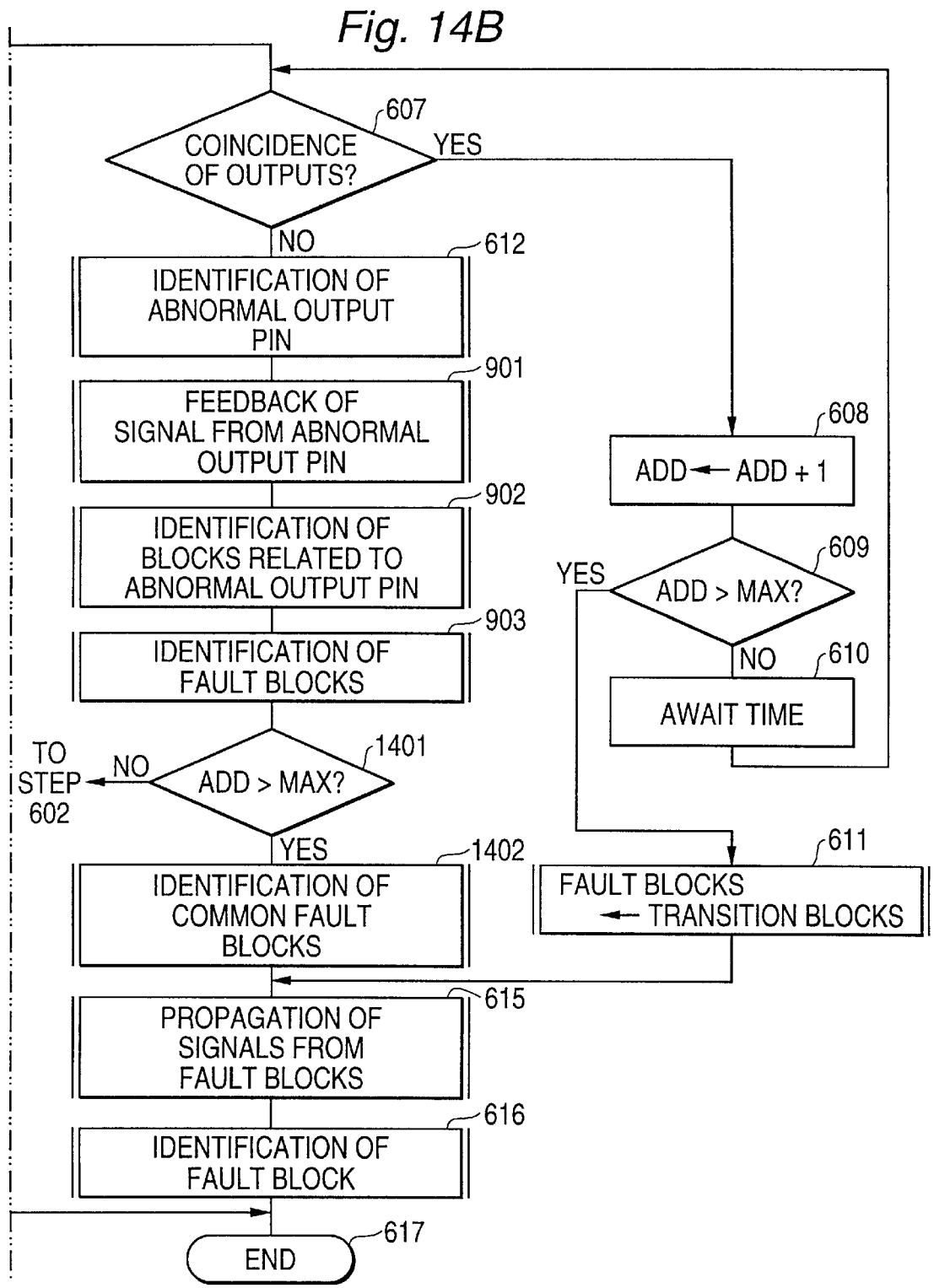

In FIGS. 14A and 14B, which illustrate a modification of the routine of FIG. 9, steps 1401 and 1402 are added to the routine of FIG. 9. As a result, the operation for identifying transition blocks at steps 603 and 606 and the operation for identifying fault blocks at steps 612, 901 to 903 can be carried out by step 1401 a plurality of times. For example, as shown in FIG. 15, first fault blocks are identified from transition blocks at FTP (a) and blocks related to an abnormal data output pin determined at FTP (b), second fault blocks are identified from transition blocks at FTP (c) and blocks related to an abnormal data output pin determined at FTP (d), and third fault blocks are identified from transition blocks at FTP (e) and blocks related to an abnormal data output pin determined at FTP (f). Next, at step 1402, common fault blocks among the first fault blocks, the second fault blocks and the third fault blocks are identified. In this case, the number of common the fault blocks is not larger than any one of the number of first fault blocks, the number of second fault blocks or the number of third fault blocks.

Figure 16A:
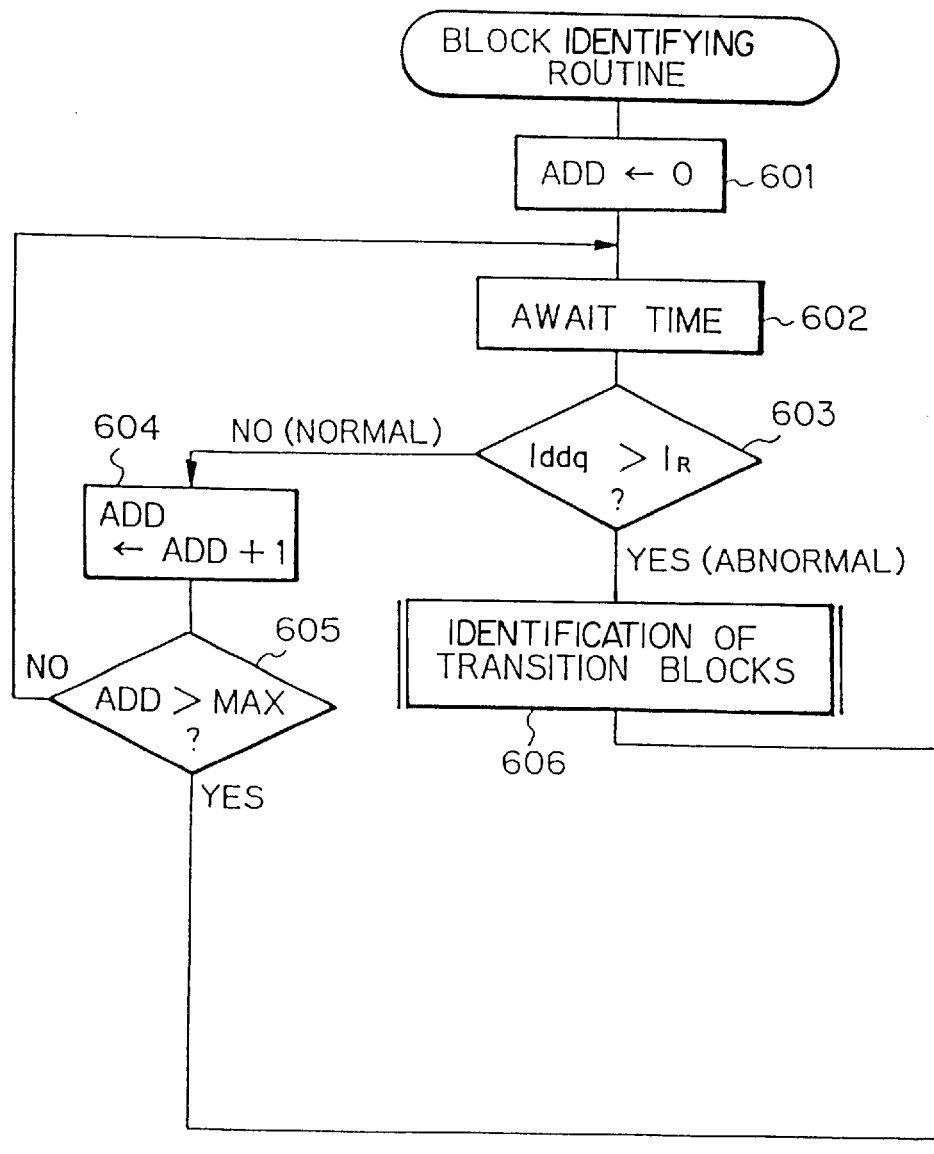
FIGS. 16A and 16B are flowcharts showing another modification of the routine of FIG. 9.
Figure 16B:
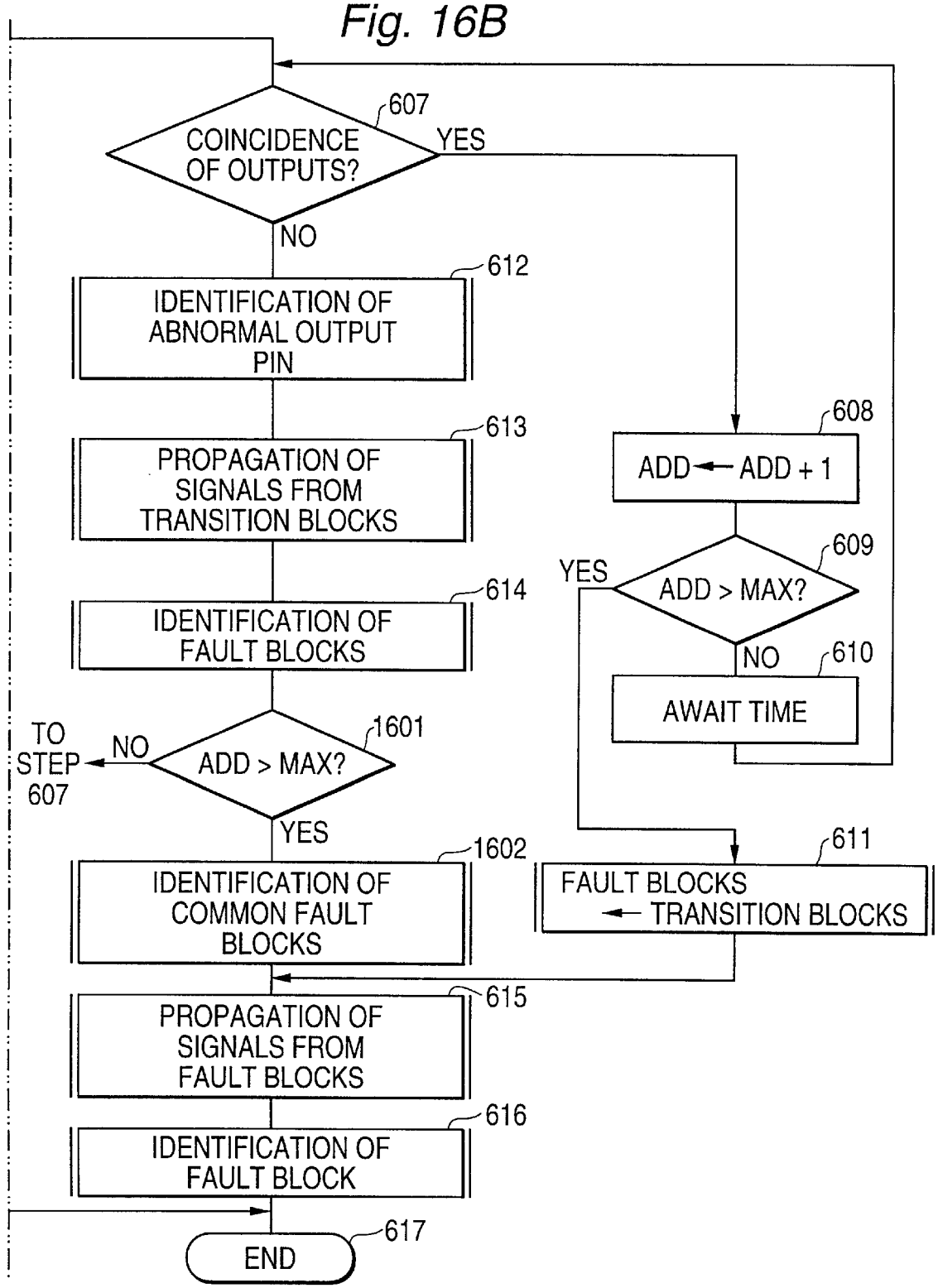

In FIGS. 16A and 16B, which illustrate another modification of the routine of FIG. 6, steps 1601 and 1602 are added to the routine of FIG. 6. As a result, only the operation for identifying fault blocks at steps 612 to 614 can be carried out by step 1601 a plurality of times, although the operation for identifying transition blocks at steps 603 and 606 is carried out only once.

For example, as shown in FIG. 17, the quiescent $V_{DD}$ supply current $I_{ddq}$ is abnormal at ETP (a), and data at the data output pins $P_b$, $P_c$, $P_d$, $P_e$ and $P_f$ are abnormal at FTP(b), FTP (c), FTP (d), FTP (e) and FTP (f), respectively.

Figure 18:
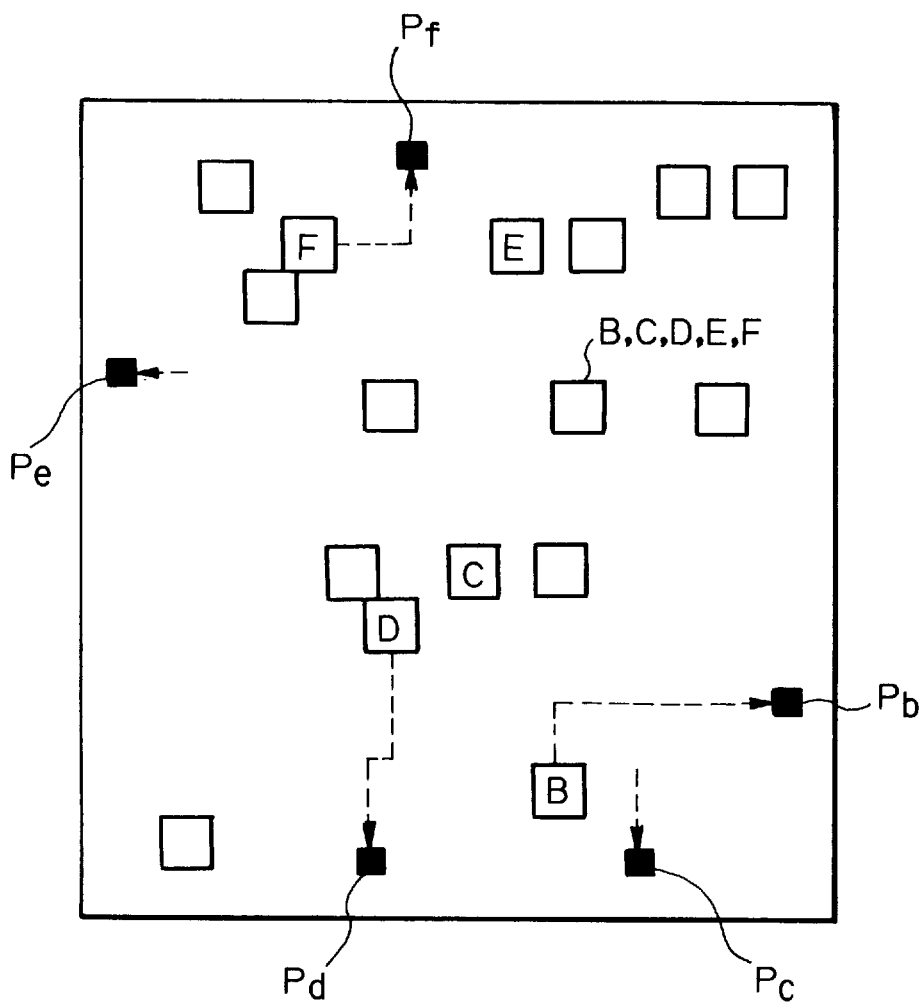
FIG. 18 is a layout diagram of the semiconductor device of FIG. 4 for explaining the operation of the flowchart of FIG. 16.

Then, as shown in FIG. 18, first fault blocks B are identified from the transition blocks at FTP (a) and blocks related to the data output pin Pb determined at FTP (b), second fault blocks C are identified from the transition blocks at FTP (a) and blocks related to the data output pin $P_c$ determined at FTP (c), third fault blocks D are identified from the transition blocks at FTP (a) and blocks related to the data output pin $P_d$ determined at FTP (d), fourth fault blocks E are identified from the transition blocks at FTP (a) and blocks related to the data output pin $P_e$ determined at FTP (e), fifth fault blocks F are identified from the transition blocks at FTP (a) and blocks related to the data output pin $P_f$ determined at FTP (f). Next, at step 1602, common fault blocks among the first fault blocks, the second fault blocks, the third fault blocks, the fourth fault blocks and the fifth fault blocks are identified. In this case, the number of the common fault blocks is not larger than any one of the number of first fault blocks, the number of second fault blocks, the number of third fault blocks, the number of fourth fault blocks or the number of fifth fault blocks.

Figure 19B:
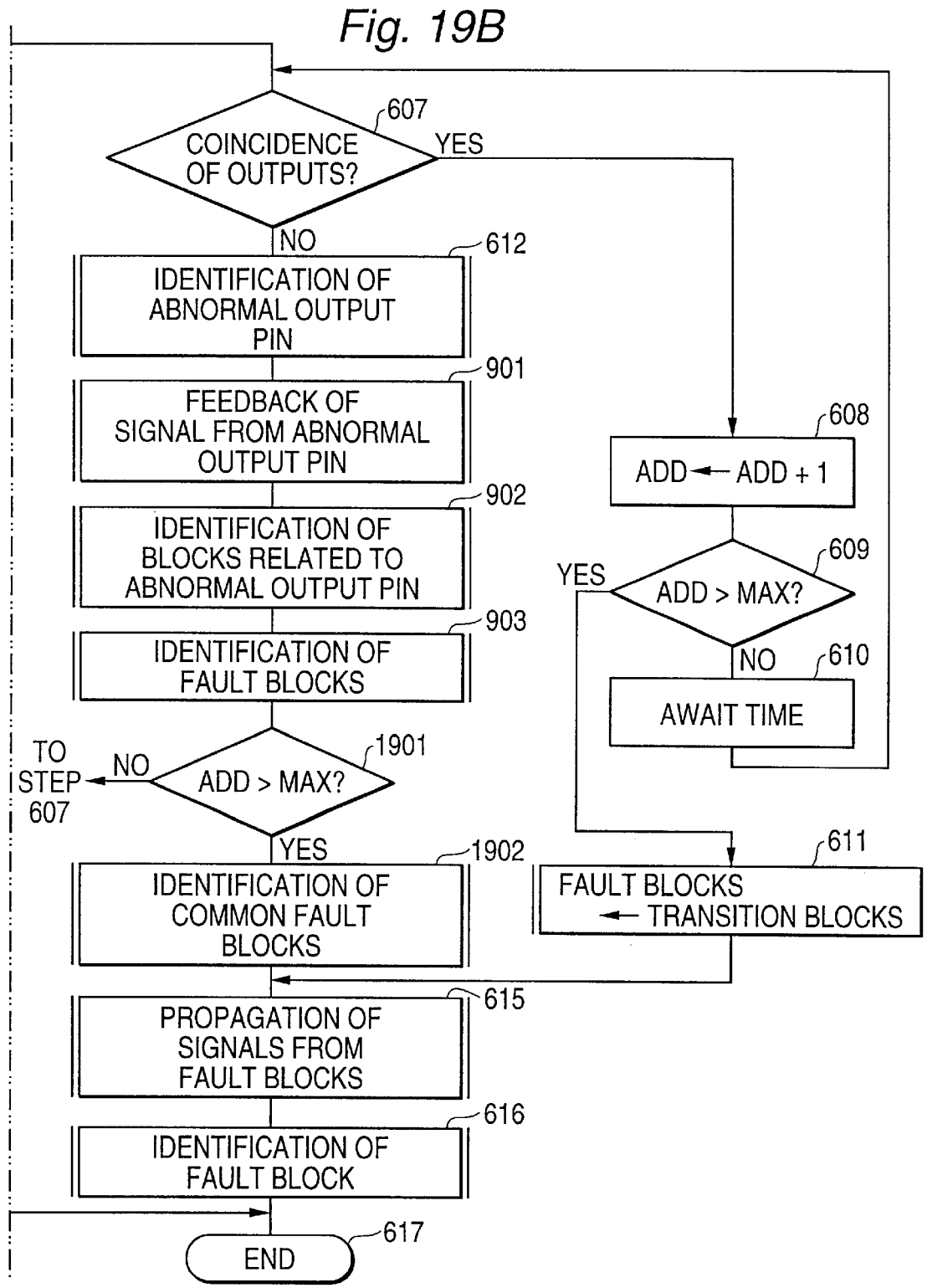

In FIGS. 19A and 19B, which illustrate another modification of the routine of FIG. 9, steps 1901 and 1902 are added to the routine of FIG. 6. As a result, only the operation for identifying fault blocks at steps 612, 901 to 614 can be carried out by step 1901 at a plurality of times, although the operation for identifying transition blocks at steps 603 and 606 is carried out only once.

For example, as shown in FIG. 20, the quiescent $V_{DD}$ supply current $I_{qqd}$ is abnormal at FTP (a), and data at the data output pins $P_b$, $P_c$, $P_d$, $P_e$ and $P_f$ are abnormal at FTP (b), FTP (c), FTP (d), FTP (e) and FTP (f), respectively.

Figure 21:
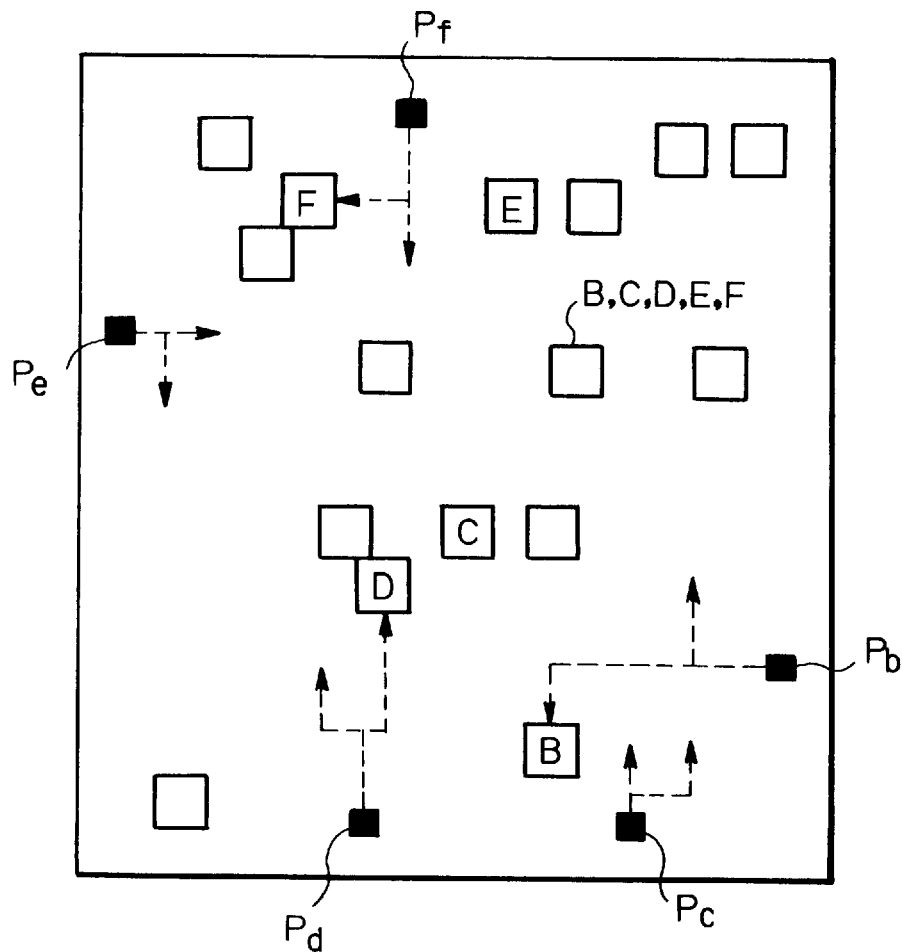
FIG. 21 is a layout diagram of the semiconductor device of FIG. 4 for explaining the operation of the flowchart of FIG. 19.

Then, as shown in FIG. 21, first fault blocks B are identified from the transition blocks at FTP (a) and blocks related to the data output pin $P_b$ determined at FTP (b), second fault blocks C are identified from the transition blocks at FTP (a) and blocks related to the data output pin $P_c$ determined at FTP (c), third fault blocks D are identified from the transition blocks at FTP (a) and blocks related to the data output pin $P_d$ determined at ETP (b), fourth fault blocks E are identified from the transition blocks at FTP (a) and blocks related to the data output pin $P_e$ determined at FTP (e), and fifth fault blocks F are identified from the transition blocks at FTP (a) and blocks related to the data output pin $P_f$ determined at FTP (f). Next, at step 1902, common fault blocks among the first fault blocks, the second fault blocks, the third fault blocks, the fourth fault blocks and the fifth fault blocks are identified. In this case, the number of common fault blocks is not larger than any one of the number of first fault blocks, the number of second fault blocks, the number of third fault blocks, the number of fourth fault blocks or the number of fifth fault blocks.

Figure 22A:
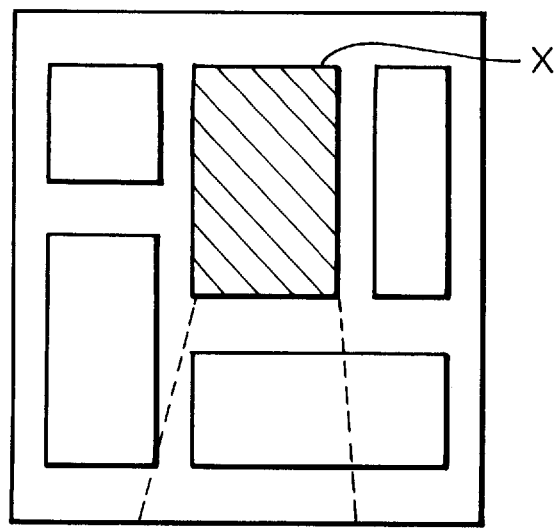
FIG. 22A, 22B and 22C are diagrams for explaining a testing system to which the present invention is applied.
Figure 22B:
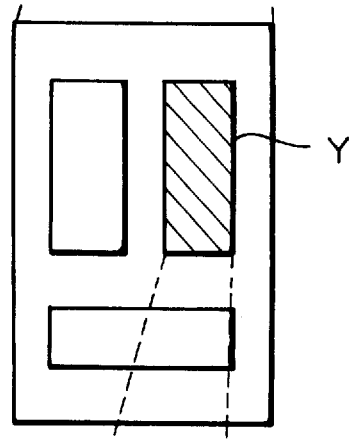
Figure 22C:
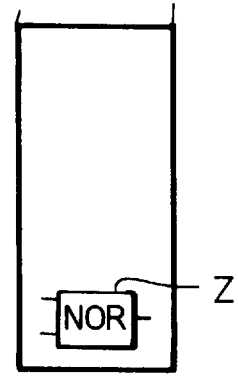

The present invention can be applied to a hierarchic testing system as illustrated in FIGS. 22A, 22B and 22C. First, one of the above-described operations is applied to a semiconductor device which is divided into a plurality of large blocks as illustrated in FIG. 22A, so that a fault block X is found. Next, one of the above-described operations is applied to the fault block X which is sub-divided into a plurality of small blocks as illustrated in FIG. 22B, so that a fault sub-block Y is found. Finally, a logic simulation is carried out to find a basic logic circuit Z such as a NOR circuit as a fault point as illustrated in FIG. 22C.

As explained hereinbefore, according to the present invention, since a fault block within a semiconductor device is determined by using a quiescent $V_{DD}$ supply current in response to functional test patterns and an abnormal data at data output pins, a fault point within the semiconductor device, i.e., a fault point within the fault block can be detected without using a large fault dictionary.

What is claimed is:

1. A system for detecting a fault block in a semiconductor device having a plurality of logic blocks, comprising: a table means for storing a plurality of functional test patterns and associated expected output patterns of operable logic circuits of said logic blocks produced upon application of said functional test patterns thereto;

means for sequentially applying said functional test patterns to said semiconductor device;

means for identifying, in accordance with said table, transition blocks from among said logic blocks associated with an i-th functional test pattern when application of said i-th functional test pattern to said semiconductor device produces a supply current in said semiconductor device which exceeds a predetermined value;

means for identifying, as an abnormal data output pin associated with a j-th functional test pattern, a data output pin having an output which is different from an expected output of said pin associated with said j-th functional test pattern when said j-th functional test pattern is applied to said semiconductor device;

means for sequentially tracing output signals of said transition blocks upon application of functional test patterns beginning with said i-th functional test pattern and ending with said j-th functional test pattern; and means for identifying as fault blocks transition blocks associated with said i-th functional test pattern whose output signals produce output at an abnormal data output pin associated with said j-th functional test pattern.

2. The system as set forth in claim 1, further comprising:

means for repeating operations of said means for sequentially applying said patterns, said means for identifying transition blocks, said means for identifying a data output pin, said means for sequentially tracing, and said means for identifying fault blocks; and means for identifying common fault blocks from among fault blocks identified by said means for identifying fault blocks.

3. The system as set forth in claim 1, further comprising:

means for repeating operations of said means for identifying a data output pin, said means for sequentially tracing, and said means for identifying fault blocks; and means for identifying at least one common fault block from among fault blocks identified by said means for identifying fault blocks.

4. A system for detecting a fault block in a semiconductor device having a plurality of logic blocks, comprising:

a table means for storing a plurality of functional test patterns and associated expected output patterns of operable logic circuits of said logic blocks produced upon application of said functional test patterns thereto;

means for sequentially applying said functional test patterns to said semiconductor device;

means for identifying, in accordance with said table, transition blocks from among said logic blocks associated with an i-th functional test pattern when application of said i-th functional test pattern to said semiconductor device produces a supply current in said semiconductor device which exceeds a predetermined value;

means for identifying, as an abnormal data output pin associated with a j-th functional test pattern, a data output pin having an output which is different from an expected output of said pin associated with said j-th functional test pattern when said j-th functional test pattern is applied to said semiconductor device;

means for feeding back signals of an abnormal data output pin by sequentially applying said functional test patterns to said semiconductor device beginning with said i-th functional test pattern and ending with said i-th functional test pattern; and means for identifying, from among said transition blocks associated with said i-th functional test pattern, fault blocks at which the signals of abnormal data output pins associated with said j-th functional test pattern have arrived through action of said means for feeding back signals.

5. The system as set forth in claim 4, further comprising:

means for repeating operations of said means for sequentially applying functional test patterns, said means for identifying transition blocks, said means for identifying an abnormal data output pin, said means for feeding back, and said means for identifying fault blocks; and means for identifying at least one common fault block from among fault blocks identified by said means for identifying fault blocks.

6. The system as set forth in claim 4, further comprising:

means for repeating operations of said means for identifying abnormal data output pins, said means for feeding back, and said means for identifying fault blocks; and means for identifying at least one common fault block from among fault blocks identified by said means for identifying fault blocks.

* * * * *